(12) United States Patent
Siomkos et al.

(10) Patent No.: US 8,351,221 B2
(45) Date of Patent: Jan. 8, 2013

(54) STACKED SHIELD COMPARTMENTS FOR ELECTRONIC COMPONENTS

(75) Inventors: John Robert Siomkos, Greensboro, NC (US); Mark Alan Crandall, Oak Ridge, NC (US); Carl Hinshaw, Burlington, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 197 days.

(21) Appl. No.: 13/006,845

(22) Filed: Jan. 14, 2011

(65) Prior Publication Data
US 2012/0182706 A1 Jul. 19, 2012

(51) Int. Cl.
*H05K 9/00* (2006.01)
(52) U.S. Cl. ......... 361/818; 361/816; 361/799; 361/800
(58) Field of Classification Search .................. 361/816, 361/818, 748, 784, 790, 799, 800, 803, 777; 257/660, 659, 690
See application file for complete search history.

(56) References Cited

U.S. PATENT DOCUMENTS

| | | | | |
|---|---|---|---|---|
| 4,838,475 A | * | 6/1989 | Mullins et al. | 228/179.1 |
| 5,530,202 A | * | 6/1996 | Dais et al. | 174/385 |
| 6,178,097 B1 | * | 1/2001 | Hauk, Jr. | 361/816 |
| 6,353,189 B1 | * | 3/2002 | Shimada et al. | 174/255 |
| 6,617,683 B2 | * | 9/2003 | Lebonheur et al. | 257/707 |
| 6,781,851 B2 | * | 8/2004 | Daoud et al. | 361/818 |
| 6,809,931 B2 | * | 10/2004 | Dove et al. | 361/707 |
| 6,919,631 B1 | * | 7/2005 | Hoffman et al. | 257/707 |
| 2002/0000649 A1 | * | 1/2002 | Tilmans et al. | 257/678 |
| 2003/0024723 A1 | * | 2/2003 | Igarashi et al. | 174/52.1 |
| 2004/0085740 A1 | * | 5/2004 | Broghammer et al. | 361/760 |
| 2004/0262749 A1 | * | 12/2004 | Matayabas et al. | 257/734 |

\* cited by examiner

*Primary Examiner* — Hoa C Nguyen
(74) *Attorney, Agent, or Firm* — Withrow & Terranova, P.L.L.C.

(57) ABSTRACT

The present disclosure is related to an electronic assembly in a stacked configuration. Electronic components are formed on substrates at each level of the stacked configuration. Electromagnetic shield compartments may be provided which substantially encapsulate the electronic components. Conductive vias are formed within the substrates on each level of the stacked configuration and coupled to one another so that the electromagnetic shields at each level of the stack can couple to a common node.

37 Claims, 22 Drawing Sheets

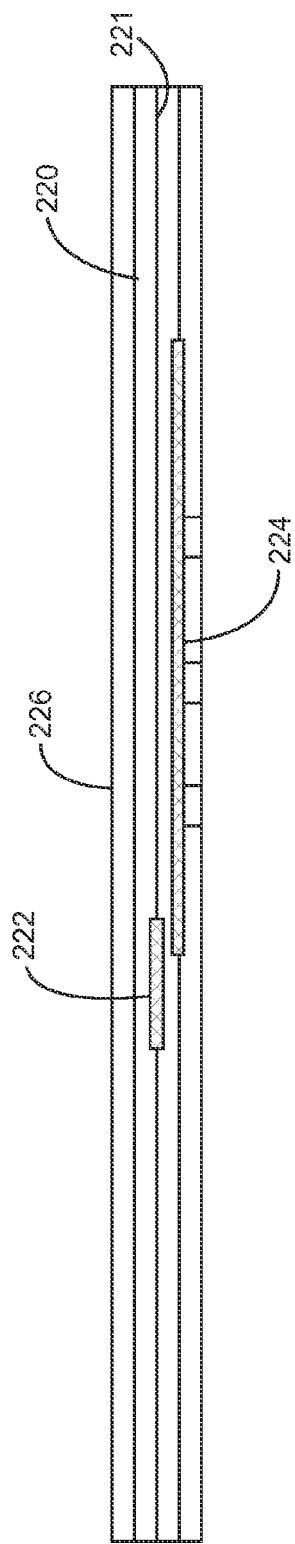
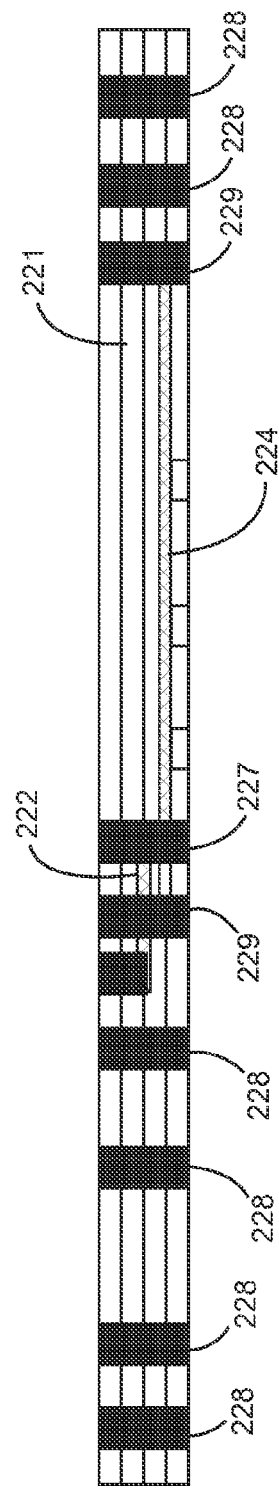
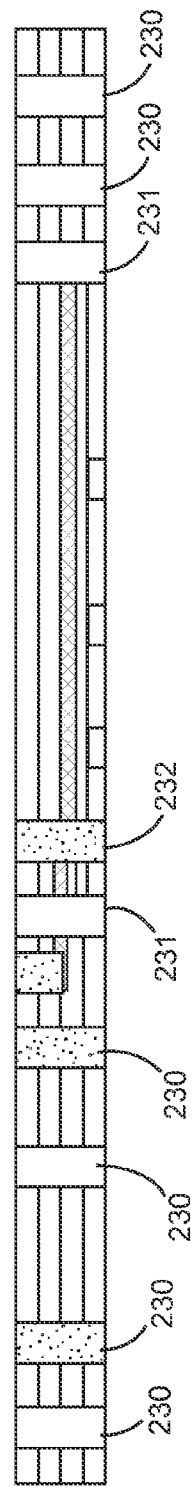
FIG. 10A
FIG. 10B
FIG. 10C

STACKED SHIELD COMPARTMENTS FOR ELECTRONIC COMPONENTS

FIELD OF THE DISCLOSURE

The present disclosure relates to assemblies of stacked electronic components.

BACKGROUND

As technology advances, there is always a need to provide a higher density of electronic components within a given space. Electronic components in electronic devices are often provided on substrates, such as the laminate of a printed circuit board. However, these substrates have a limited surface area. To maximize the volume available, substrates may be stacked on top of one another. Of course, one of the problems with stacking is cross-coupling between the electronic components. Cross-coupling can interfere with the intended operation of the electronic components and if severe enough render the electronic components on the substrate inoperable.

To reduce cross-coupling between electronic components in a stack, electromagnetic shields have been provided to enclose the electronic components and protect them from external electromagnetic emissions. These electromagnetic shields may be formed from an electromagnetic material. When the electromagnetic shields are coupled to an external node, such as a ground node, external electromagnetic emissions are conducted on the shield and grounded. Often however, these electromagnetic shields provide no protection within the substrate itself thus allowing for external electromagnetic emissions to penetrate the substrate. This is particularly troublesome in stacked configurations where the electronic components may be stacked on top of one another. Also, since the electromagnetic shields are on different levels of the stack, grounding the shield requires coupling each electromagnetic shield to a different external node. As a result, the electromagnetic shields may not be properly grounded and cross coupling can occur between the shields and the electronic components.

Thus, what is needed is an electronic assembly in a stacked configuration which allows for the electronic components to be protected by an electromagnetic shield while allowing each of the electromagnetic shields to couple to a common node.

SUMMARY OF THE DISCLOSURE

The present disclosure provides an electronic assembly of electronic components in a stacked configuration. In one embodiment, substrates are stacked over one another and one or more electronic components are formed on a surface of each of the substrates. Preferably, these substrates are formed from a polyamide, ceramic and/or alumina and overmolds are formed on the surfaces of each of the substrates to cover the electronic components.

To prevent external electromagnetic emissions from interfering with the operation of the electronic components, a conformal shield is provided over each of the overmolds and a conductive layer is provided within each of the substrates to form an electromagnetic shield on each of the substrates. Conductive vias are formed in each of the substrates which couple to the electromagnetic shields. Also, the conductive vias coupled to electromagnetic shields on substrates on higher levels of the stack couple to conductive vias on substrates on lower levels of the stack. These conductive vias may thus be coupled so that each electromagnetic shield on different levels of the stack is provided with a conductive path and thus all of the electromagnetic shields can be coupled to a common node. In this manner, electronic components can be provided in a stacked configuration while allowing each of the electromagnetic shields that protect these electronic components to each have an independent path to the common node.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together serve to explain the principles of the disclosure.

FIGS. 10A-10H illustrates steps for creating a lower level of a first embodiment of an electronic assembly in accordance with the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
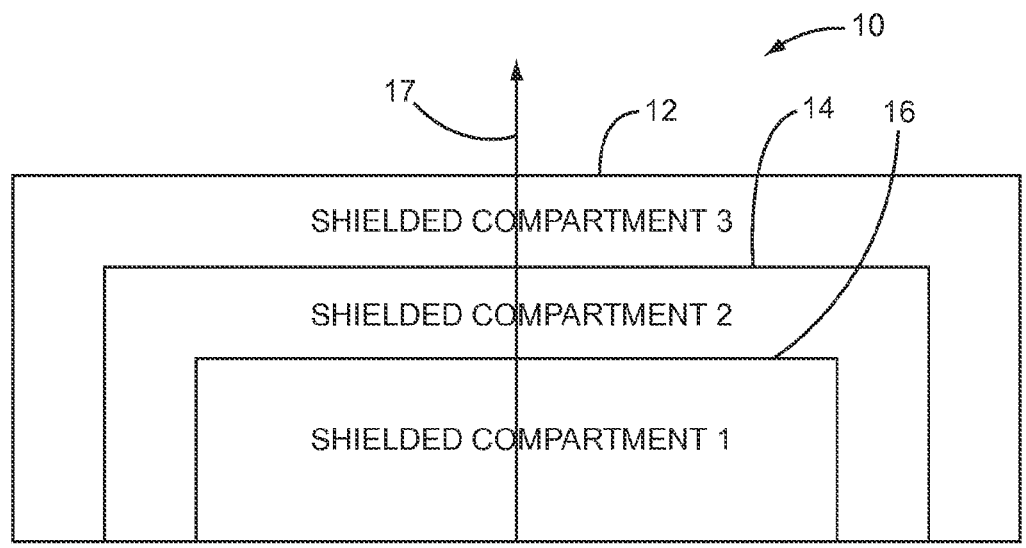
FIG. 1 is a cross sectional view of one embodiment of a stacked configuration having shield compartments that are directly over one another.
Figure 1A:
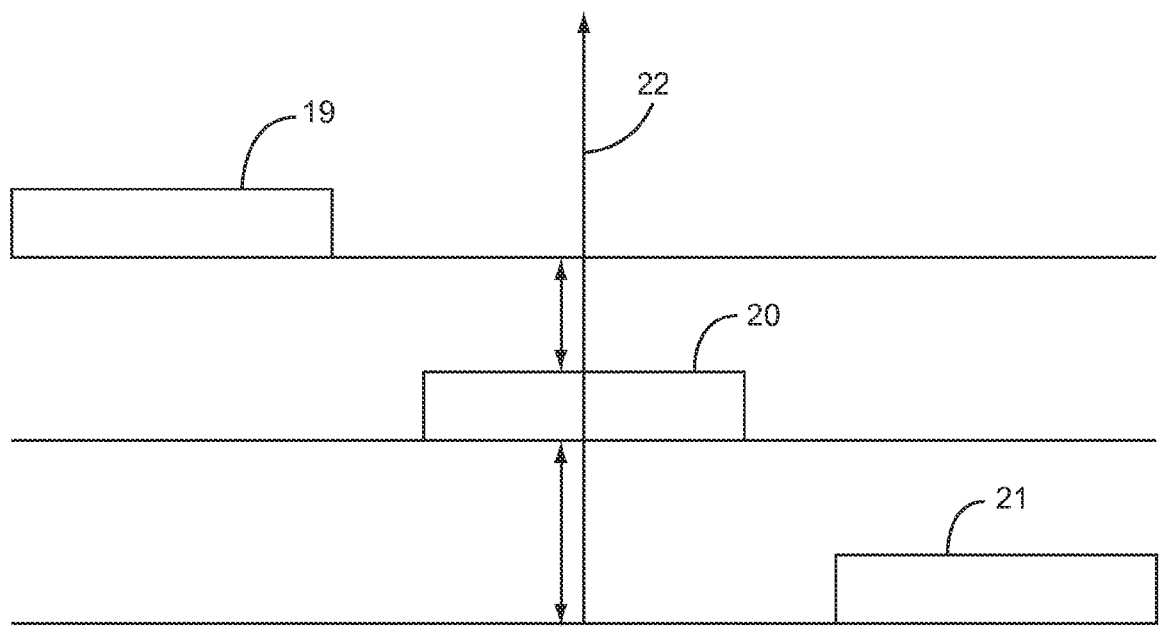
FIG. 1A is a cross sectional view of another embodiment of a stacked configuration having shield compartments that are not directly over one another but rather are displaced from one another along a common axis.

The present disclosure relates generally to providing electronic assemblies in a stacked configuration. In a stacked configuration, one object is provided over another object and thus the objects are said to be stacked. In some stacked configurations, the objects in the stack are aligned along a common axis and thus are directly over one another. However, in other stacked configurations, some or all of the objects are simply displaced from one another relative to an axis. FIG. 1 illustrates one embodiment of a stacked configuration 10 of shield compartments 12, 14, 16 which are aligned along a common axis 17 and thus are directly over one another. A top shield compartment 12 is provided directly over middle shield compartment 14 and lower shield compartment 16 while the middle shield compartment 14 is provided directly over the lower shield compartment 16. Since the shield compartments 12, 14, 16 are provided directly over one another the shield compartments may be said to be co-axial. On the other hand, FIG. 1A illustrates another embodiment of a stacked configuration 18 in which the shield compartments 19, 20, 21 are not directly over one another but rather are simply displaced along the common axis 22.

Figure 2:
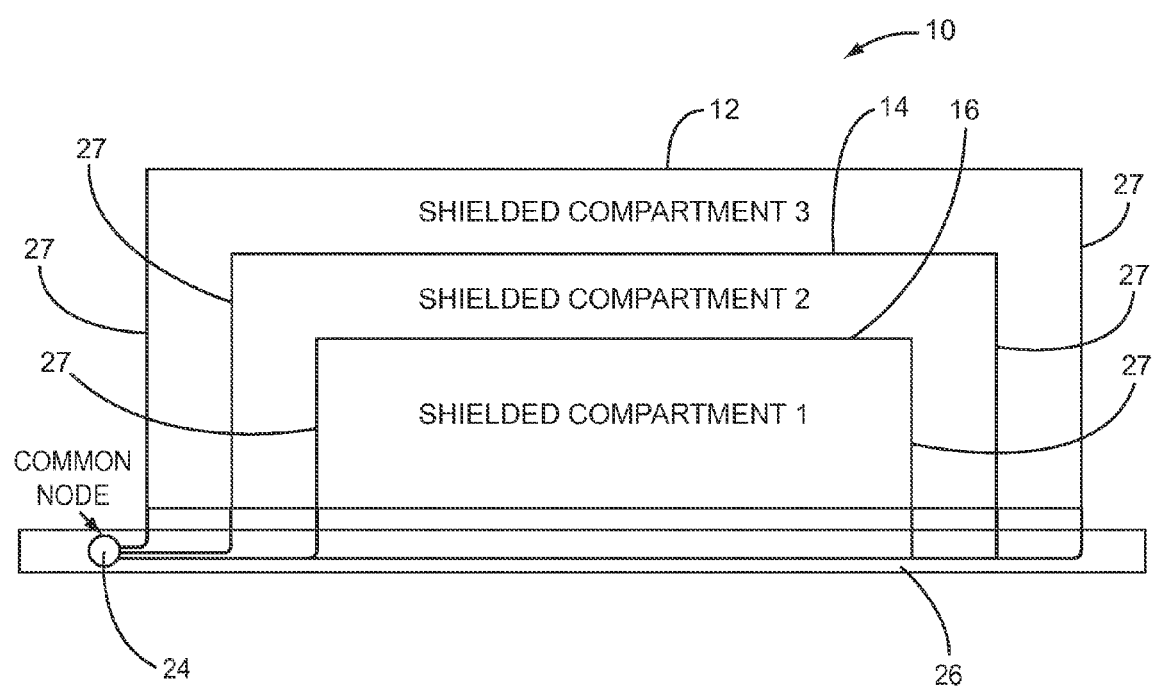
FIG. 2 is a cross sectional view of the stacked configuration illustrated in FIG. 1 in which each shield compartment is coupled to a common node.

Next, in FIG. 2, the shield compartments 12, 14, 16 of stacked configuration 10, are coupled to a common node 24 which may for example be a ground plate 26. This assures that shield compartments 12, 14, 16 are properly grounded. While shield compartments 12, 14, 16 may couple to a single physical location, as illustrated in FIG. 2, to be coupled to the common node 24, common node 24 simply refers to a node in an electromagnetic network that is at a reference voltage. In stacked configuration 10, the ground plate 26 is at a reference voltage, in this case ground. Thus, shield compartments 12, 14, 16 may be connected to any location of the ground plate 26 and be coupled to the common node 24. In this embodiment, the common node 24 is beneath the stacked configuration 10 and therefore conductive paths 27 are required so that shield compartments 12, 14, 16 may couple to the common node 24.

Figure 3:
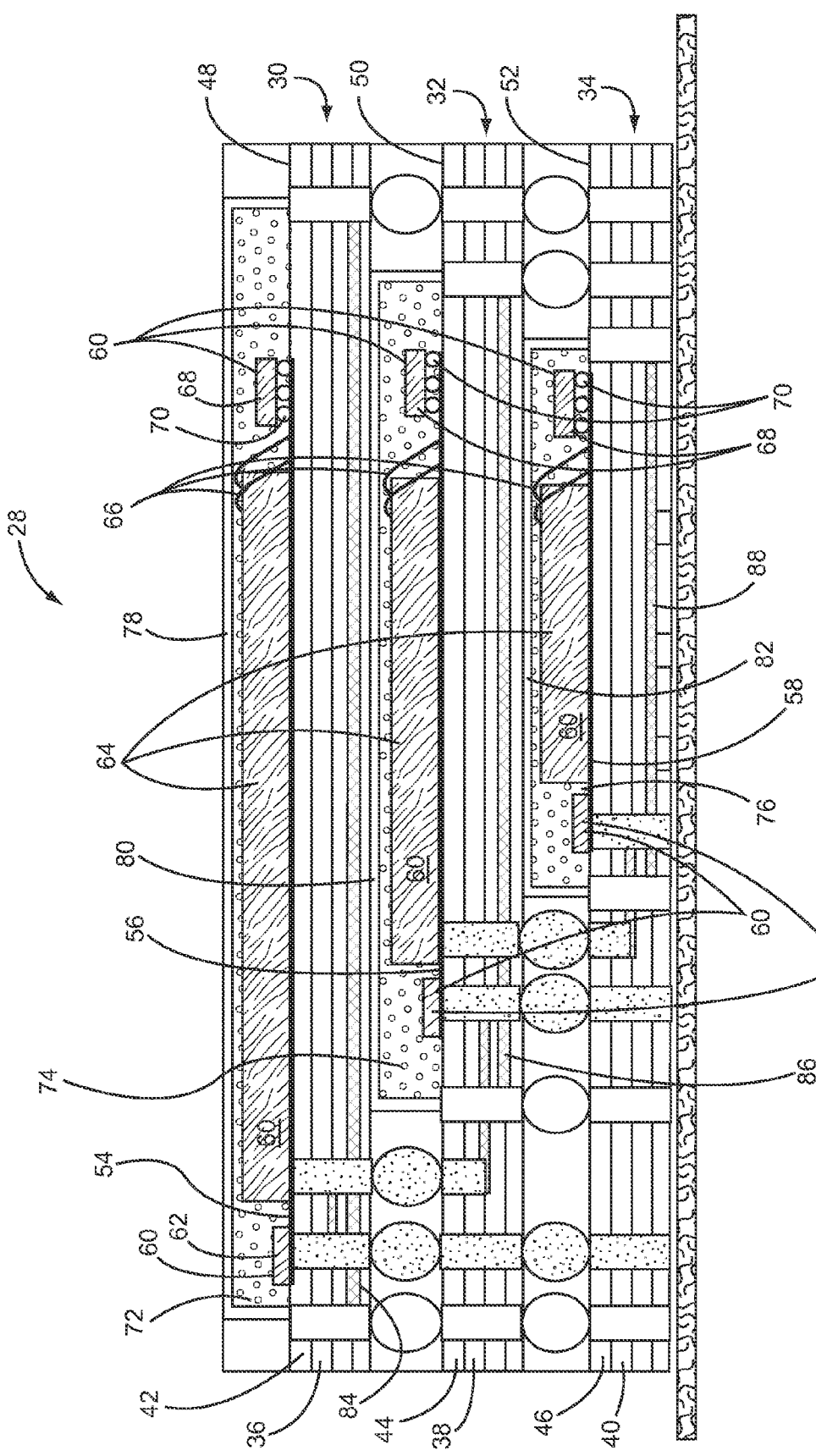
FIG. 3 is a cross sectional view of one embodiment of an electronic assembly in accordance with the disclosure.

FIG. 3 illustrates one embodiment of an electronic assembly 28 in accordance to the disclosure. Electronic assembly 28 has a top circuit board 30, a middle circuit board 32, and a lower circuit board 34. The base of each circuit board 30, 32, 34 is formed from a substrate 36, 38, 40. In electronic assembly 28, the top substrate 36 is provided over both the middle substrate 38 and the lower substrate 40 while the middle substrate 38 is provided over the lower substrate 40. In this manner, circuit boards 30, 32, 34 and their substrates 36, 38, 40 are in a stacked configuration. Substrates 36, 38, 40 may be formed from any material(s) utilized to support electronic components. For example, substrates 36, 38, 40 may be formed from laminates such as FR-1, FR-2, FR-3, FR-4, FR-5, FR-6, CEM-1, CEM-2, CEM-3, CEM-4, CEM-5, and the like. Substrates 36, 38, 40 may also be formed from ceramics, and/or alumina.

Each substrate 36, 38, 40 has a substrate body 42, 44, 46 that defines a surface 48, 50, 52 having a component area 54, 56, 58. Component areas 54, 56, 58 include one or more electronic components 60 formed on the surfaces 48, 50, 52. In this example, each component area 54, 56, 58 include multiple electronic components 60, and component areas 54, 56, 58 are stacked directly over one another. Thus, the top component area 54 is directly over both the middle component area 56 and the lower component area 58 while the middle component area 56 is directly over the lower component area 58.

Electronic components 60 may be attached to component areas 54, 56, 58 in different ways. In this example, soldered electronic components 62 on the left of component areas 54, 56, 58 have been attached to component areas 54, 56, 58 by solder. Wire bonded electronic components 64 in the middle of component areas 54, 56, 58 are attached to components areas 54, 56, 58 utilizing a wire bond 66. C4 electronic components 68 on the right of component areas 54, 56, 58 are attached to component areas 54, 56, 58 utilizing a flip-chip die 70. Also, electronic components 60 may be any type of electronic component. For example, electronic components 60 may be an electronic circuit built on its own semiconductor substrate, such as a processor, volatile memory, non-volatile memory, a radio frequency circuit, or a micro-mechanical system (MEMS) device. Electronic components 60 may also be electrical devices such as filters, capacitors, inductors, and resistors or electronic circuits having any combination of these electronic devices.

To physically protect the electronic components 60, overmolds 72, 74, 76, may be provided over the component areas 54, 56, 58 to cover the electronic components 60. For electromagnetic protection, conformal shields 78, 80, 82 are formed on the overmolds 72, 74, 76 and conductive layers 84, 86, 88 are provided within each of the substrate bodies 42, 44, 46 of the substrates 36, 38, 40, respectively. In this embodiment, overmolds 72, 74, 76 are formed from a dielectric material to insulate the electronic components 60. The conformal shields 78, 80, 82 and the conductive layers 84, 86, 88 are formed from a conductive material, such as copper (Cu), aluminum (Al), Silver (Ag), or gold (Au). Thus, conformal shields 78, 80, 82 and conductive layers 84, 86, 88 are able to ground external electromagnetic emissions and thus prevent, or at least reduce, the external electromagnetic emission that reach the electronic components 60 in the substrates 36, 38, 40. In addition, a conductive layer 84 is provided within the substrate body 42 of the top substrate 36. Conductive layer 84 may be substantially parallel with the surface 48. Similarly, a conductive layer 86 may be provided within substrate body 44 of the middle substrate 38 and a conductive layer 88 may be provided within substrate body 46 of the lower substrate 40. These conductive layers 86, 88 may also be substantially parallel with surfaces 50, 52, respectively.

It should be noted that the conductive layers 84, 86, 88 in the illustrated embodiment do not need to be perfectly parallel with surfaces 48, 50, 52. The conductive layers 84, 86, 88 need only be sufficiently parallel with surfaces 48, 50, 52 so that the conductive layers 84, 86, 88 form an electromagnetic barrier between the bottom of the substrates 36, 38, 40 and the component areas 54, 56, 58 of the substrates 36, 38, 40. Furthermore, certain sections of conductive layers 84, 86, 88 may even be perpendicular with surfaces 48, 50, 52, if for example, conductive layers 84, 86, 88 need to be formed around other components within the substrate bodies 42, 44, 46.

Figure 4:
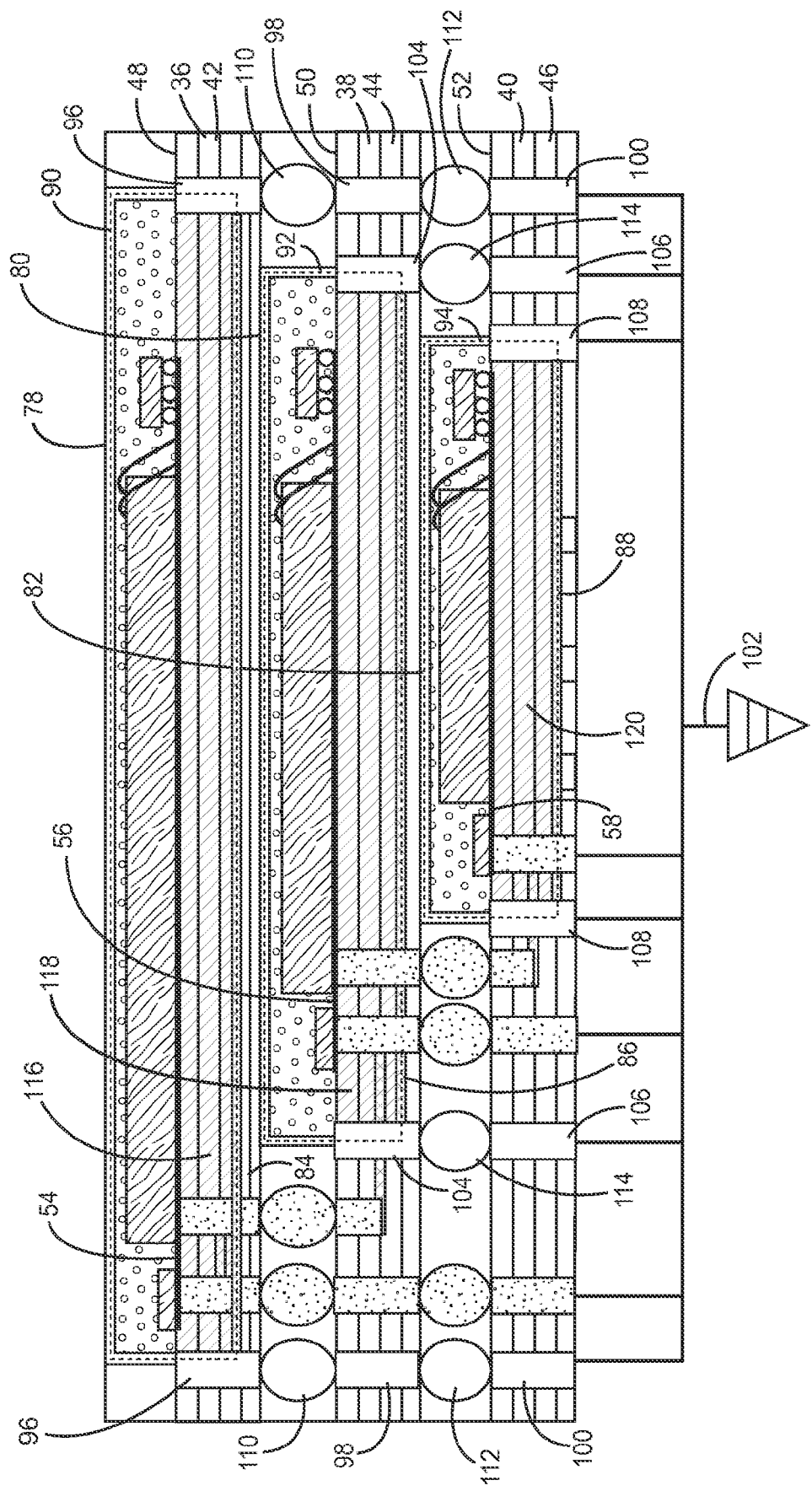
FIG. 4 is a cross sectional view of the embodiment of the electronic assembly illustrated in FIG. 3 coupled to a common node.

Referring now to FIG. 4, the conformal shields 78, 80, 82 (shown in FIG. 3) and the conductive layers 84, 86, 88 (shown in FIG. 3) may each form part of an electromagnetic shield compartment 90, 92, 94. In this embodiment, the top electromagnetic shield compartment 90 is directly over both the middle electromagnetic shield compartment 92 and the lower electromagnetic shield compartment 94 while the middle electromagnetic shield compartment 92 is directly over the lower electromagnetic shield compartment 94. The top electromagnetic shield compartment 90 is coupled to a first plurality of conductive vias 96 formed within the substrate body 42 of the top substrate 36. The first plurality of conductive vias 96 are coupled to a second plurality of conductive vias 98 formed within the substrate body 44 of the middle substrate 38. Second plurality of conductive vias 98 are coupled to a third plurality of conductive vias 100 formed within the substrate body 46 of the lower substrate 40. The third plurality of conductive vias 100 may be coupled to a common node 102, such as a ground node. In this manner, the coupled sets of conductive vias 96, 98, 100 form a conductive path so that the top electromagnetic shield compartment 90 can be independently coupled to the common node 102.

Similarly, the middle electromagnetic shield compartment 92 is coupled to a fourth plurality of conductive vias 104 formed within the substrate body 44 of the middle substrate 38. The fourth plurality of conductive vias 104 are coupled to a fifth plurality of conductive vias 106 formed within the substrate body 46 of the lower substrate 40. The fifth plurality of conductive vias 106 may also be coupled to the common node 102. In this manner, the coupled sets of conductive vias 104, 106 form a conductive path so that the middle electromagnetic shield compartment 92 can be independently coupled to the common node 102. Finally, the lower electromagnetic shield compartment 94 is coupled to a sixth plurality of conductive vias 108 formed within the substrate body 46 of the lower substrate 40. The sixth plurality of conductive vias 108 may also be coupled to the common node 102 and thus the lower electromagnetic shield compartment 94 is independently coupled to the common node 102.

To couple the first plurality of conductive vias 96 and the second plurality of conductive vias 98, a first plurality of conductive elements 110 may be positioned between the top and middle substrates 36, 38 and couples the first and second plurality of conductive vias, 96, 98. In the illustrated embodiment, the first plurality of conductive elements 110 also provide support to the top substrate 36 over the middle substrate 38 and provide stand-off between the substrates 36, 38.

Next, the second plurality of conductive vias 98 and the third plurality of conductive vias 100 may be coupled to one another by a second plurality of conductive elements 112 positioned between the middle substrate 38 and the lower substrate 40. In the illustrated embodiment, the second plurality of conductive elements 112 supports the middle substrate 38 over the lower substrate 40. A third plurality of conductive elements 114 may be positioned between substrates 36, 38 to couple the fourth plurality of conductive vias 104 to the fifth plurality of conductive vias 106. The third plurality of conductive elements 114 may also support the middle substrate 38 over the lower substrate 40

Electromagnetic shield compartments 90, 92, 94 substantially encapsulate the component areas 54, 56, 58. In the illustrated embodiment, the first plurality of conductive vias 96 is part of the top electromagnetic shield compartment 90. To provide shielding, the first plurality of conductive vias 96 substantially surround a shielded volume 116 in the substrate body 42 of the top substrate 36 between the component area 54 of the surface 48 and the conductive layer 84. As explained in further detail below, the first plurality of conductive vias 96 may each be discrete from one another and thus some area of the shielded volume 116 in the substrate body 42 may be exposed. As demonstrated by this embodiment, the top electromagnetic shield compartment 90 does not need to fully encapsulate the component area 54 to provide the necessary electromagnetic shielding. Of course, no electromagnetic shield is perfect and even when fully encapsulated some external electromagnetic emissions may penetrate the top electromagnetic shield compartment 90. The top electromagnetic shield compartment 90 however need only encapsulate the component area 54 so that the top electromagnetic shield compartment 90 presents an electromagnetic barrier to external electromagnetic emissions.

Next, the fourth plurality of conductive vias 104 in this embodiment form part of the middle electromagnetic shield compartment 92 and may substantially surround a shielded volume 118 in the substrate body 44 of the middle substrate 38 between the component area 56 of the surface 50 and the conductive layer 86. Also, the sixth plurality of conductive vias 108 may form part of the lower electromagnetic shield compartment 94 and may substantially surround a shielded volume 120 between the component area 58 on the surface 52 and the conductive layer 88.

To provide for a more compact stacked configuration, the electromagnetic shield compartments 90, 92, 94 in the illustrated embodiment are stacked directly over one another and are thus co-axial. Also, the component areas 56, 58 substantially encapsulated by the middle and lower electromagnetic shield compartments 92, 94 are smaller than the top electromagnetic shield compartment 90. Similarly, the component area 58 encapsulated by the lower electromagnetic shield compartment 94 is smaller than the middle electromagnetic shield compartment 92. Since the first, fourth, and sixth plurality of conductive vias 96, 104, 108 form part of the electromagnetic shield compartment 90, 92, 94, as explained above, the descending size of component areas 54, 56, 58 from top to bottom allows for the electromagnetic shield compartments 90, 92, 94 to remain isolated while still having an independent conductive path to the common node 102. Thus, the second plurality of conductive vias 98 may substantially surround the fourth plurality of conductive vias 104 within the substrate body 44 of the middle substrate 38. In the substrate body 46 of the lower substrate 40, the fifth plurality of conductive vias 106 may substantially surround the sixth plurality of conductive vias 108 and the third plurality of conductive vias 100 may substantially surround the fifth plurality of conductive vias 106.

The first, second, and third plurality of conductive elements 110, 112, 114 may also be configured to maintain the conductive paths for the electromagnetic shield compartments 90, 92, 94 isolated from one another. In this embodiment, the first plurality of conductive elements 110 that are positioned between the top substrate 36 and the middle substrate 38 substantially surround the conformal shield 80 on the middle substrate 38. Next, the third plurality of conductive elements 114 positioned between the middle substrate 38 and the lower substrate 40 are provided to substantially surround the conformal shield 82. The second plurality of conductive elements 112 positioned between the middle substrate 38 and the lower substrate 40 are provided to substantially surround the third plurality of conductive elements 114. In this manner, first, second, third, fourth, fifth, and sixth plurality of conductive vias, 96, 98, 100, 104, 106, 108 and the first, second, and third plurality of conductive elements 110, 112, 114 can form independent conductive paths to the common node 102 while allowing the electromagnetic shield compartments 90, 92, 94 to be stacked directly over one another.

Figure 5:
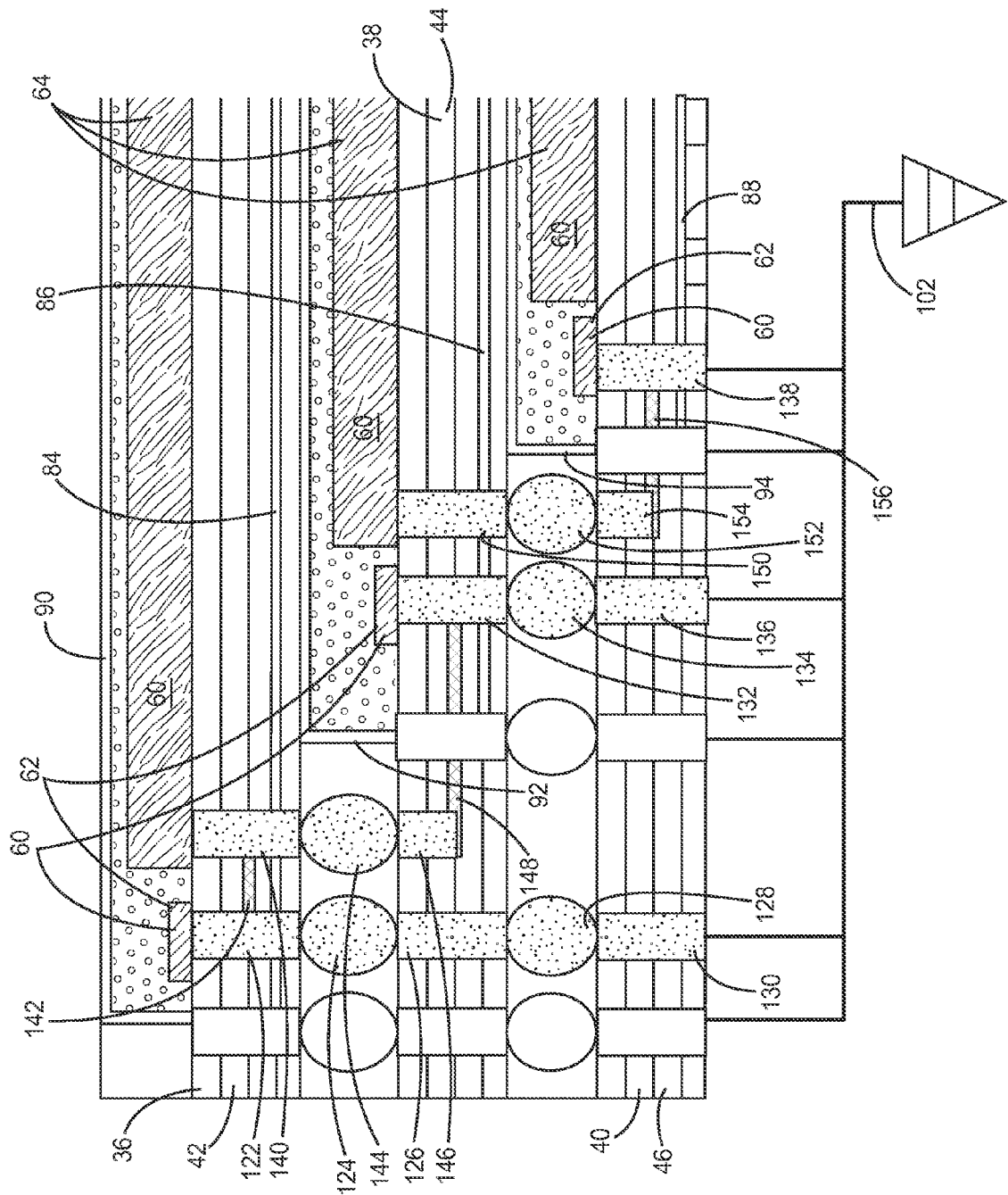
FIG. 5 is a close up cross sectional view of the electronic assembly illustrated in FIG. 3.

Referring now to FIG. 5, electronic components 60 within the electromagnetic shield compartments 90, 92, 94 may also need to be coupled to the common node 102. In the illustrated embodiment, a conductive path to ground is provided for the soldered electronic component 62 within the top electromagnetic shield compartment 90. At the beginning of the conductive path, the top substrate 36 has a conductive via 122 provided within its substrate body 42. Conductive via 122 is coupled to the soldered electronic component 62 within the top electromagnetic shield compartment 90. The conductive via 122 extends through the conductive layer 84. An isolation device (not shown) may be provided between the conductive via 122 and the conductive layer 84 to ensure that the components are maintained in isolation. The conductive via 122 is then coupled to a conductive element 124 positioned between the top substrate 36 and the middle substrate 38. Next, another conductive via 126 may be provided within the substrate body 44 of the middle substrate 38. The conductive via 126 may be coupled to the conductive element 124 and then to another conductive element 128 positioned between the middle substrate 38 and the lower substrate 40.

The lower substrate 40 may have yet another conductive via 130 provided within its substrate body 46 that is coupled to the conductive element 128 and to the common node 102 which completes the conductive path. In this manner, conductive vias 122, 126, 130 and conductive elements 124, 128 may form conductive paths that couple the soldered electronic component 62 within the top electromagnetic shield compartment 90 to the common node 102.

Similarly, a conductive via 132 within the substrate body 44 of middle substrate 38, a conductive element 134 positioned between middle and lower substrates 38, 40, and a conductive via 136 provided within the substrate body 46 of the lower substrate 40 may form a conductive path to the common node 102 for the soldered electronic component 62 within the middle electromagnetic shield compartment 92. Furthermore, a conductive via 138 may be provided within the substrate body 46 of the lower substrate 40 and coupled to the common node 102 to provide a conductive path for the soldered electronic component 62 in the lower electromagnetic shield compartment 94.

Other electronic components 60 may also be coupled to the common node 102 by coupling to these conductive paths. For example, in the illustrated embodiment, the wire bonded electronic component 64 within the top electromagnetic shield compartment 90 is coupled to a conductive via 140 provided within the substrate body 42 of the top substrate 36. A conductive layer 142 is then provided within the substrate body 42 of the top substrate 36 to couple the conductive via 140 and the conductive via 122. By coupling the conductive via 140 to the conductive via 122, the wire bonded electronic component 64 within the top electromagnetic shield compartment 90 may be coupled to the common node 102. In an alternative embodiment, the conductive via 122, the conductive layer 142, and the conductive via 140 may also be utilized to transmit input/output signals between the soldered electronic component 62 and the wire bonded electronic component 64 within the top electromagnetic shield compartment 90.

Next, a common conductive path may also be formed that couple still other electronic components 60 to the common node 102 or, alternatively, transmit input/output signals between components. In the illustrated embodiment, the conductive via 140 extends through the conductive layer 84 and is coupled to a conductive element 144 that is positioned between the top and middle substrates 36, 38. A conductive via 146, conductive layer 148, and the conductive via 132 are coupled to one another and provided within the substrate body 44 of the middle substrate 38. As explained above, the conductive via 132 is part of a conductive path that connects the soldered electronic component 62 within the middle electromagnetic shield compartment 92 to the common node 102. Thus, the wire bonded electronic component 64 within the top electromagnetic shield compartment 90 may also couple to the common node 102 by the conductive via 132. In an alternate embodiment, the conductive via 132 may also transmit input/output signals to the soldered electronic component 62 within the middle electromagnetic shield compartment 92. Similarly, conductive element 150, conductive element 152, conductive via 154, conductive layer 156, and the conductive via 138, may couple the wire bonded electronic component 64 within the middle electromagnetic shield compartment 92 to the common node 102 or transmit input/output signals to the soldered electronic component 62 within the lower electromagnetic shield compartment 94.

Figure 6:
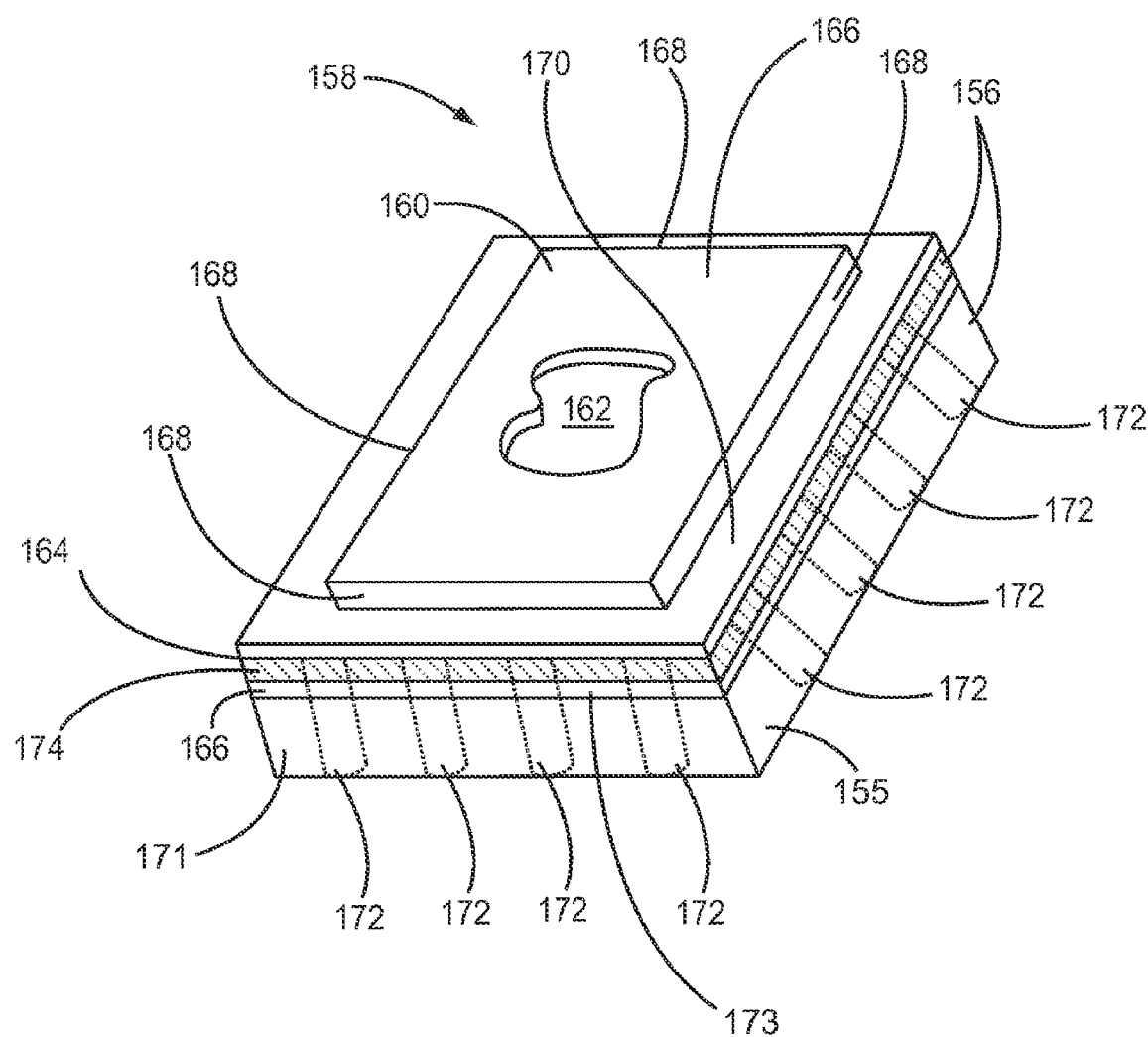
FIG. 6 is a perspective view of one embodiment of an electromagnetic shield compartment formed within a substrate.

Next, FIG. 6 illustrates layers in a substrate 155 and an embodiment of an electromagnetic shield compartment 158 that is formed on the substrate 155. The illustrated electromagnetic shield compartment 158 has a conformal shield 160 formed over a component area 162 that is defined on a surface 164 of the substrate 155. In this embodiment, the conformal shield 160 has a top portion 166 and side portions 168 that extend down from the top portion 166 and surround the component area 162. The conformal shield 160 also includes a portion 170 that extends from the side portions 168 and lays flat against the surface 164 of the substrate 155.

Within a substrate body 171 of the substrate 155, conductive vias 172 are configured to form part of the electromagnetic shield compartment 158. The conductive vias 172 extend through and are coupled to the conductive layer 173. One end of the conductive vias 172 is coupled to the conformal shield 160 while the other oppositely disposed end may be exposed at the bottom of the substrate 155. The exposed oppositely disposed end of the conductive vias 172 may be utilized to form external connections to, for example, a common node as explained above.

The conductive vias 172 form part of the electromagnetic shield compartment 158 by substantially surrounding a shielded volume 174 below the component area 162 and above the conductive layer 173. In the illustrated embodiment, the conductive vias 172 do not fully surround the shielded volume 174. Thus, some areas along a perimeter of the shielded volume 174 are exposed. However, the conductive vias 172 are provided close enough to one another so as to present an electromagnetic barrier to external electromagnetic emissions. In an alternative embodiment, a single conductive via 172 may be provided that couples to the conformal shield 160 and/or the conductive layer 173 and is shaped so as to surround and encapsulate the shielded volume 174.

Figure 7:
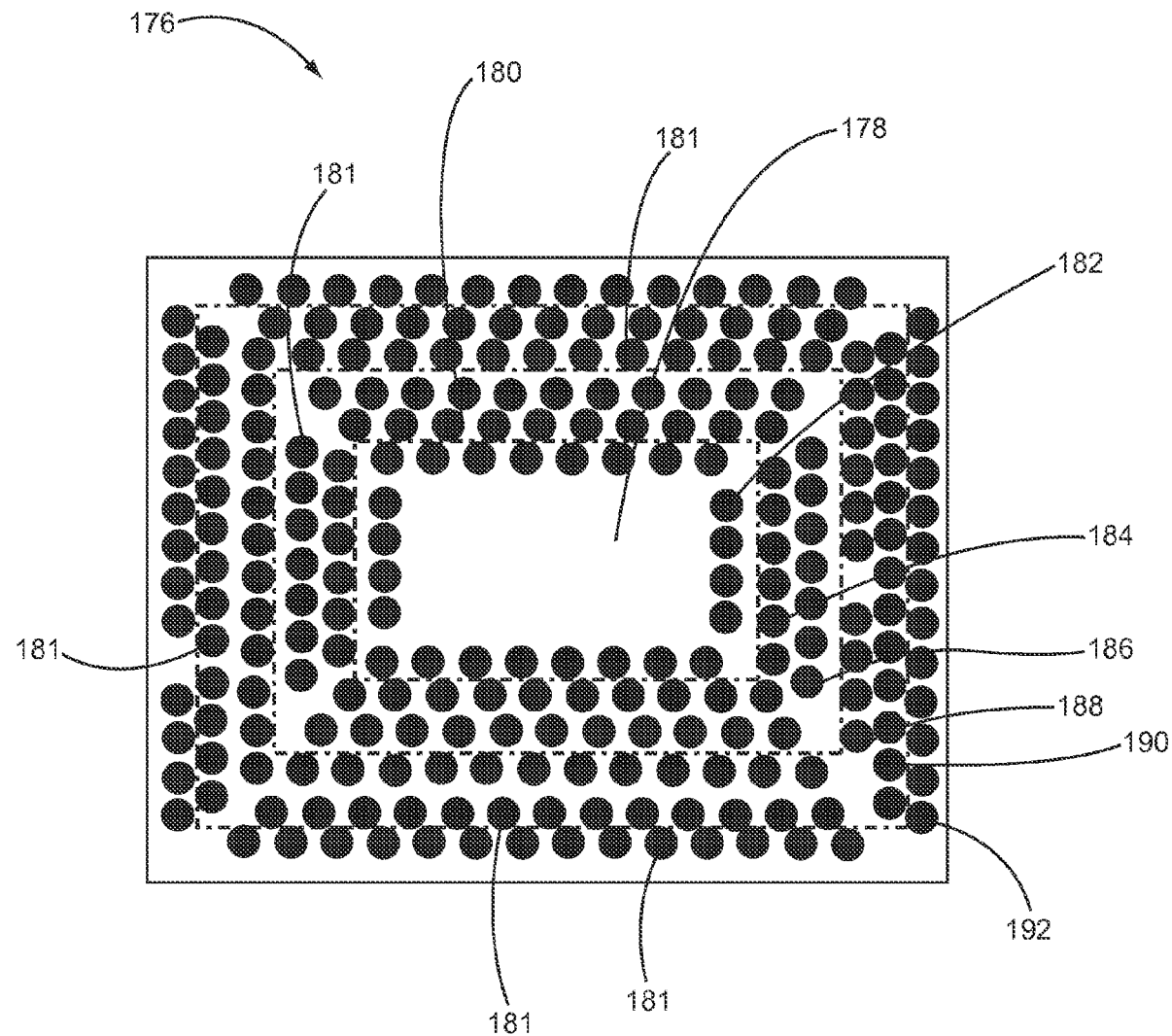
FIG. 7 is a top view of one embodiment of a substrate formed with rings of apertures.

Next, FIG. 7 illustrates a lower substrate 176 that may be utilized to form one embodiment of a stacked configuration. The lower substrate 176 defines a component area 178 having a perimeter 180. A plurality of apertures 181 may be drilled or etched into the lower substrate 176. These apertures 181 are configured as aperture rings 182, 184, 186, 188, 190, 192. The aperture rings 182, 184, 186, 188, 190, 192 may be of any shape and in this embodiment aperture rings 182, 184, 186, 188, 190, 192 are substantially rectangular. The aperture ring 182 is formed within the perimeter 180 of the component area 178 while aperture rings 184, 186, 188, 190, 192 substantially surround the component area 178. The aperture rings 182, 184, 186, 188, 190, 192 are relatively concentric along a common axis.

Figure 8:
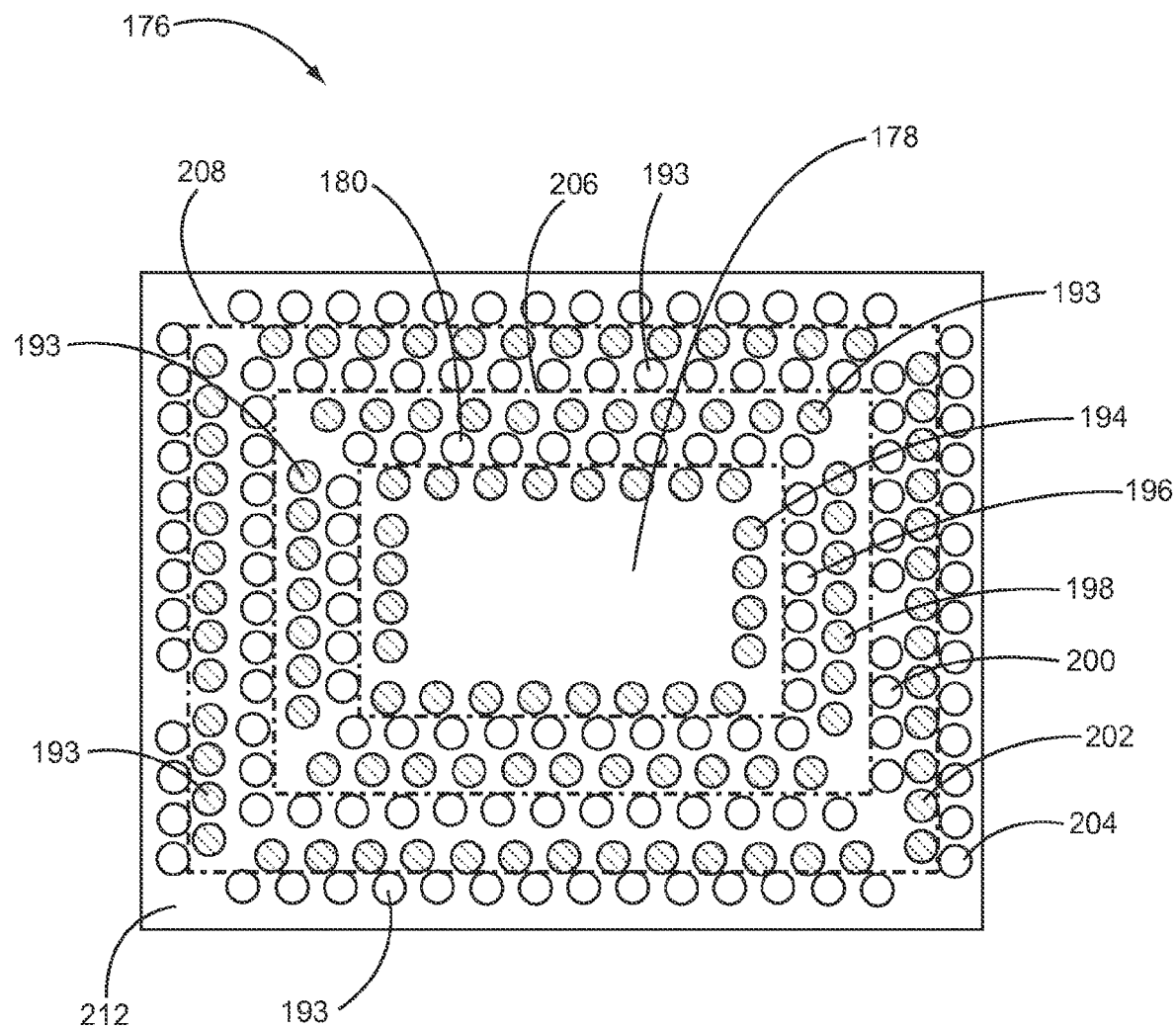
FIG. 8 is a top view of the embodiment of the substrate illustrated in FIG. 7 after rings of conductive vias are provided within the apertures.

Referring now to FIG. 8, a plurality of conductive vias 193 are formed within the aperture rings 182, 184, 186, 188, 190, 192 and configured as rings 194, 196, 198, 200, 202, 204 of conductive vias 193. The conductive vias 193 may be formed from any type of connecting conductor. For example, the conductive vias 193 may be formed as plated through holes, conductive pillars, wires, and/or the like. The ring 194 of conductive vias 193 is positioned within the component area 178 while rings 196, 198, 200, 202, 204 of conductive vias 193 substantially surround the component area 178. The ring 194 of conductive vias 193 may couple to electronic components formed on the component area 178 of the lower substrate 176. In this manner, these electronic components can couple to a common node and/or transmit input/output signals to other electronic components. The ring 196 of conductive vias 193 may couple to an electromagnetic shield compartment formed on the lower substrate 176.

The rings 198, 200, 202, 204 of conductive vias 193 form connections to substrates above the lower substrate 176. In this stacked configuration, the electromagnetic shield compartments may be isolated from one another and have independent conductive paths to a common node, as described above. FIG. 8 illustrates a projection 206 onto the lower substrate 176 of the perimeter of a component area on a middle substrate. This projection 206 illustrates that the component area of the middle substrate is larger than the component area 178 of the lower substrate 176. The ring 198 of conductive vias 193 is positioned within the projection 206 of the perimeter of the component area in the middle substrate. The ring 198 of conductive vias 193 may be utilized to couple to electronic components formed on the middle substrate. The ring 200 of conductive vias 193 may couple to an electromagnetic shield compartment on the middle substrate and provide a conductive path through the lower substrate 176 to a common node. The middle substrate of the stacked configuration may look similar to the lower substrate 176 illustrated in FIG. 8 except that rings 194, 196 of conductive vias 193 are not needed in the middle substrate.

FIG. 8 also illustrates a projection 208 onto the lower substrate 176 of the perimeter of a component area on a top substrate. This projection 208 shows that the component area of the top substrate is larger than both the component area of the middle substrate and the component area 178 of the lower substrate 176. The ring 202 of conductive vias 193 is positioned within the projection 208 of the perimeter in the component area of the top substrate. This ring 202 of conductive vias 193 may be coupled to electronic components on the top substrate. The ring 204 of conductive vias 193 may couple to an electromagnetic shield compartment in the top substrate and provide a conductive path through the lower substrate 176 to a common node. The top substrate of the stacked configuration may look similar to the lower substrate 176 except top substrate does not need the rings 194, 196, 198, 200 of conductive vias 193.

If additional substrate layers are part of the stacked configuration, additional rings of conductive vias may be provided in the lower substrate to substantially surround rings 194, 196, 198, 200, 202, 204 of conductive vias 193. Alternatively, if the stacked configuration only has two levels, rings 202, 204 of conductive vias 193 in the lower substrate 176 are not necessary.

Figure 9:
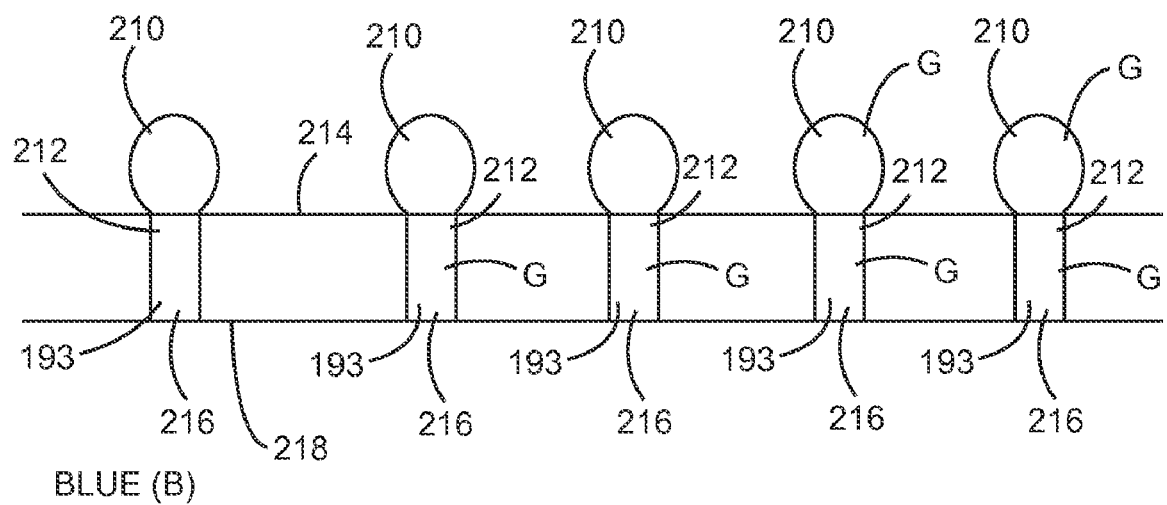
FIG. 9 is a cross sectional view of the embodiment of the substrate illustrated in FIG. 8 after conductive elements have been coupled to the conductive vias.

Referring to now FIG. 9, conductive elements 210 may be coupled to the conductive vias 193 to form a grid array of conductive elements 210 on the lower substrate 176 (illustrated in FIG. 8). The conductive vias 193 illustrated in FIG. 9 may be from one of the rings 198, 200, 202, 204 (illustrated in FIG. 8) of conductive vias 193 which couple to the electromagnetic shield compartments or electronic components on the middle or top substrates. While conductive elements 210 are shown to be of a different shape than conductive vias 193, this is not necessarily the case. The conductive elements 210 may be shaped exactly like or similar to the conductive vias 193. The conductive elements 210 may also be attached to the conductive vias 193 to form an integrated whole. For example, the conductive elements 210 may be formed by soldering a conductive material onto an end 212 of the conductive vias 193 that is exposed on the surface 214 of the lower substrate 176. Another end 216 of the conductive vias 193 may be exposed on a surface 218 oppositely disposed from the surface 214. In the lower substrate 176, this other end 216 may be coupled to a common node.

Figure 10D:
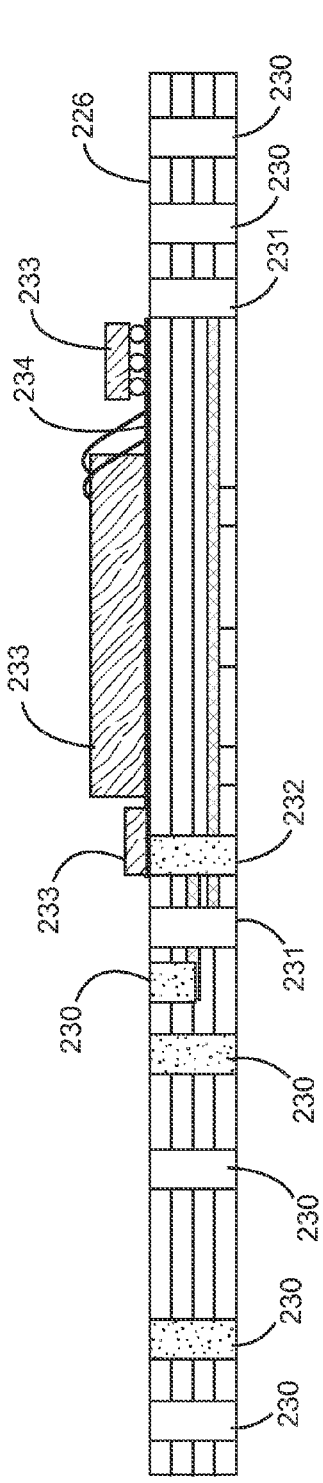

FIGS. 10A-10H illustrates steps for creating a lower level of one embodiment of a stacked configuration. A lower substrate 220 is provided having a substrate body 221 that includes conductive layers 222, 224 (FIG. 10A). The conductive layers 222, 224 may be substantially parallel with a surface 226 of the lower substrate 220. Next, apertures 227, 228, 229 are drilled or etched into the substrate body 221 (FIG. 10B). For the particular apertures 227, 229 which are formed through conductive layers 222, 224, isolation devices (not shown) may be disposed within these apertures 227, 229. Also, apertures 227, 228, 229 may be configured as rings, as described above, parts of rings, and/or rows in the substrate body 221. Next, conductive vias 230, 231, 232 are formed within the apertures 228, 229 (FIG. 10O). These conductive vias 230, 231, 232 may be configured as rings, as described above, parts of rings, and/or rows within the substrate body 221. Electronic components 233 may be assembled on a component area 234 of the surface 226 (FIG. 10D). Furthermore, one or more of these electronic components 233 may be coupled to conductive via 232.

Figure 10E:
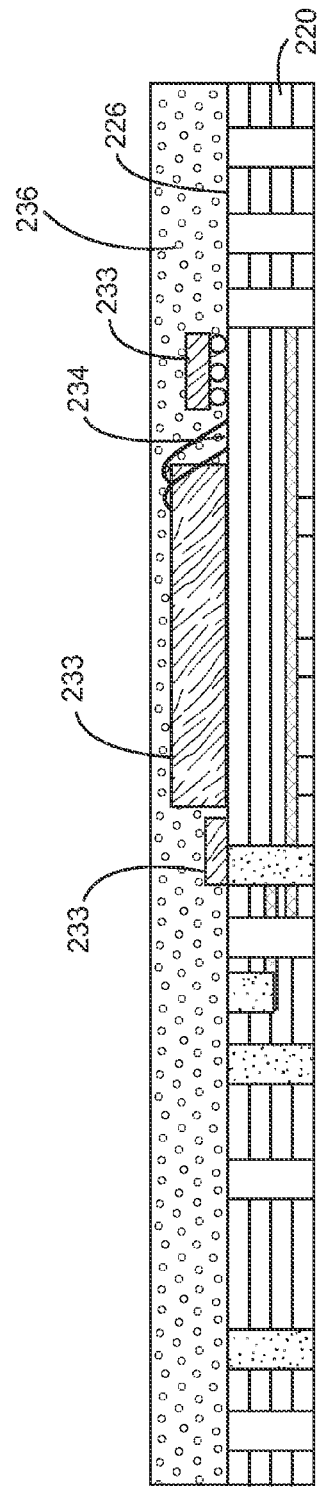
Figure 10F:
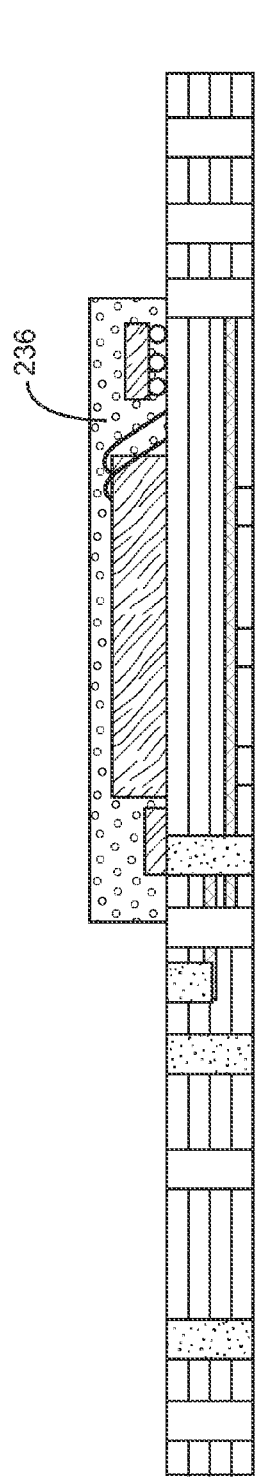
Figure 10G:
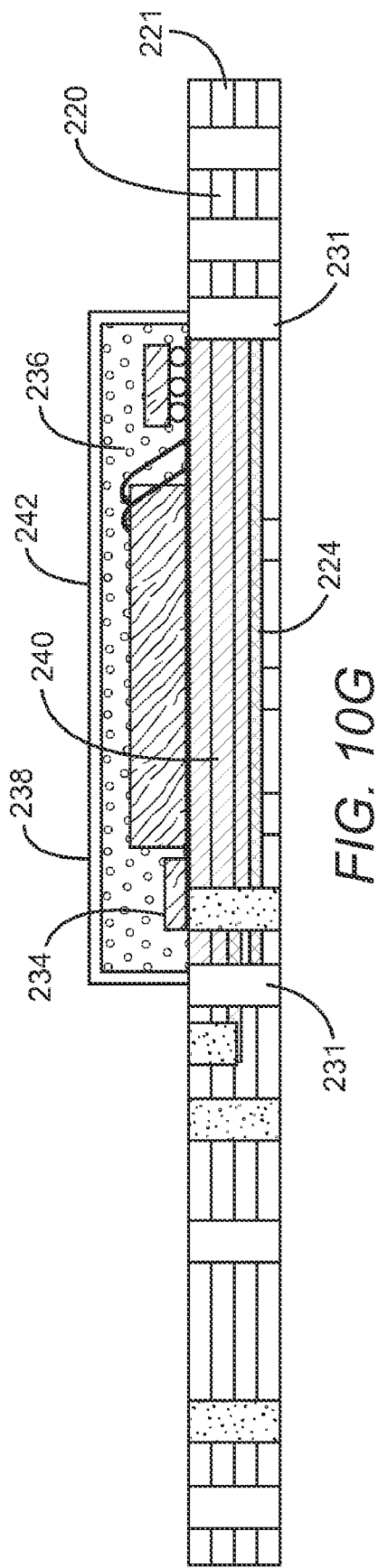
Figure 10H:
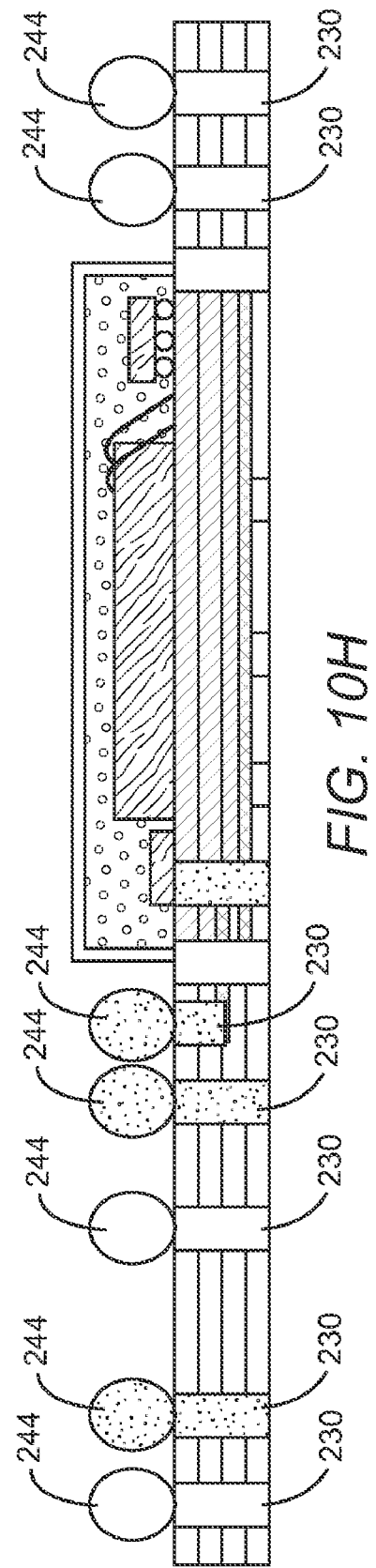

Next, an overmold 236 is disposed over the surface 226 of the lower substrate 220 to cover the electronic components 233 (FIG. 10E). The overmold 236 is then shaped into a desired form (FIG. 10F). A conductive material may then be coated or electroplated over the overmold 236 to form a conformal shield 238 (FIG. 10G). This conformal shield 238 may be coupled to the conductive vias 231 which in this embodiment may be configured as a ring of conductive vias 231 to substantially surround a shielded volume 240 of the lower substrate 220. Thus, in this embodiment, a lower shield compartment 242 is formed from the conformal shield 238, the conductive vias 231, and the conductive layer 224 so that the component area 234 is substantially encapsulated. Conductive elements 244 may then be provided on the conductive vias 230 to form a lower level 246 of the stacked configuration (FIG. 10H).

Figure 11A:
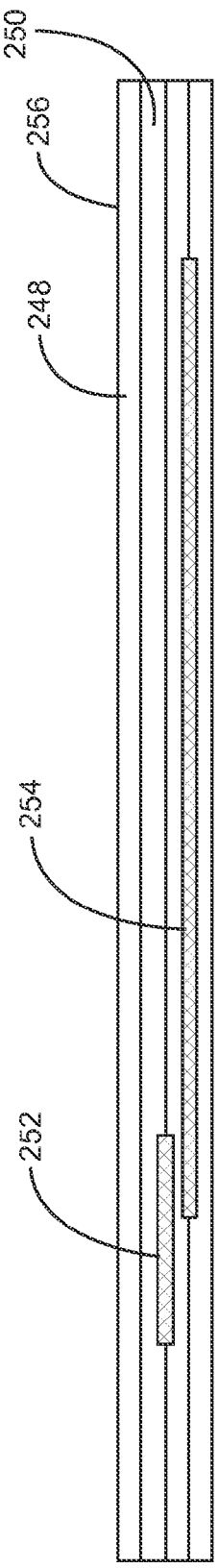
FIGS. 11A-11H illustrates steps for creating a middle level of the first embodiment of the electronic assembly.
Figure 11B:
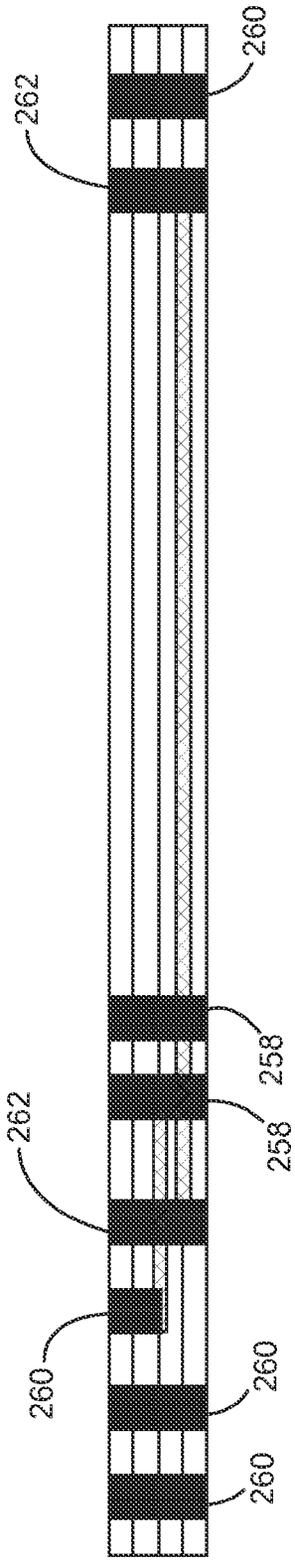
Figure 11C:
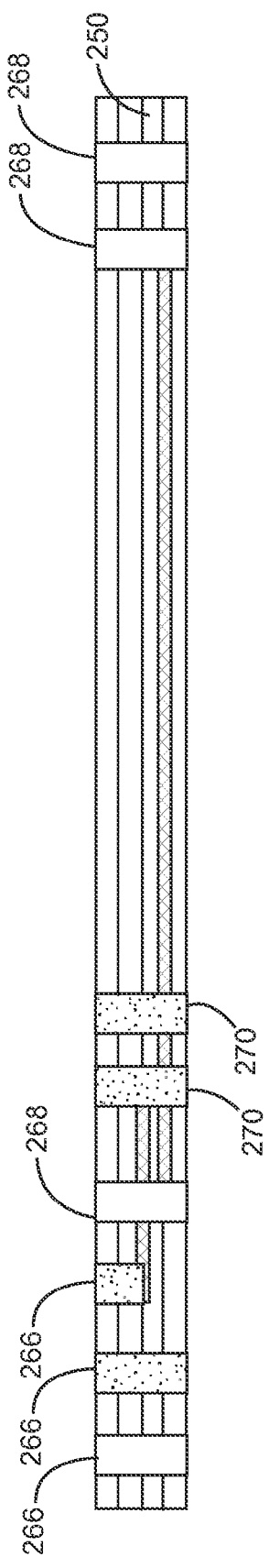
Figure 11D:
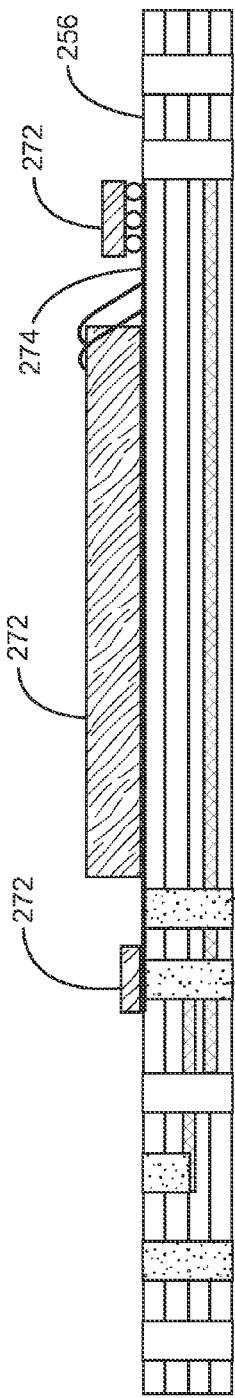
Figure 11E:
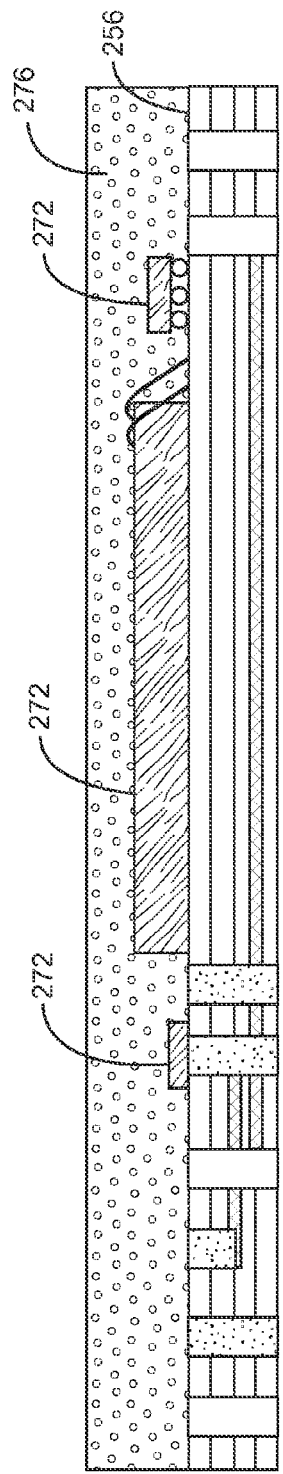

Next, FIGS. 11A-11H illustrates steps for creating a middle level of the stacked configuration. A middle substrate 248 is provided having a substrate body 250 that includes conductive layers 252, 254 (FIG. 11A). The conductive layers 252, 254 may be substantially parallel with a surface 256 of the middle substrate 248. Next, apertures 258, 260, 262 are drilled or etched into the substrate body 250 of the middle substrate 248 (FIG. 11B). For the particular apertures 258, 262 which are formed through conductive layers 252, 254, isolation devices (not shown) may be disposed within these apertures 258, 262. Also, apertures 258, 260, 262 may be configured as rings, as described above, parts of rings, and/or rows in the substrate body 250. Next, conductive vias 266, 268, 270 may be formed within the apertures 228, 229 (FIG. 11C). These conductive vias 266, 268, 270 may be configured as rings, as described above, parts of rings, and/or rows within the substrate body 250. Electronic components 272 may then be provided on a component area 274 on the surface 256 and coupled to conductive via 270 (FIG. 11D).

Figure 11F:
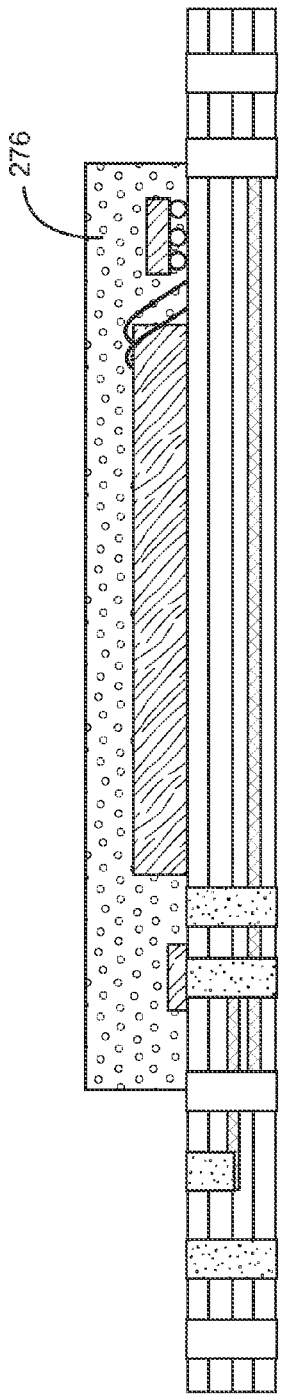
Figure 11G:
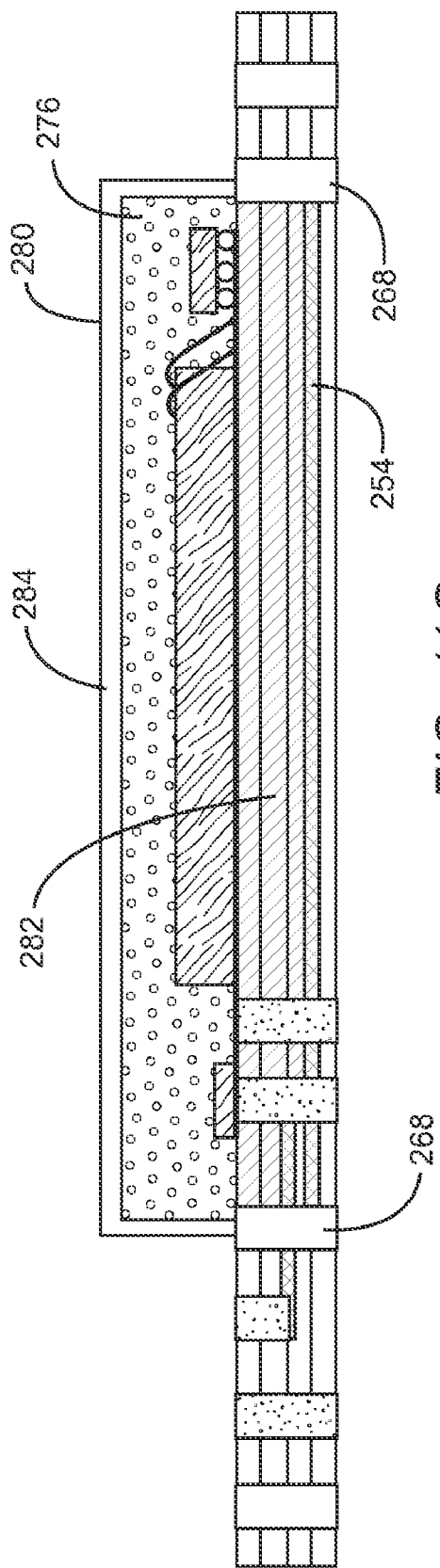
Figure 11H:
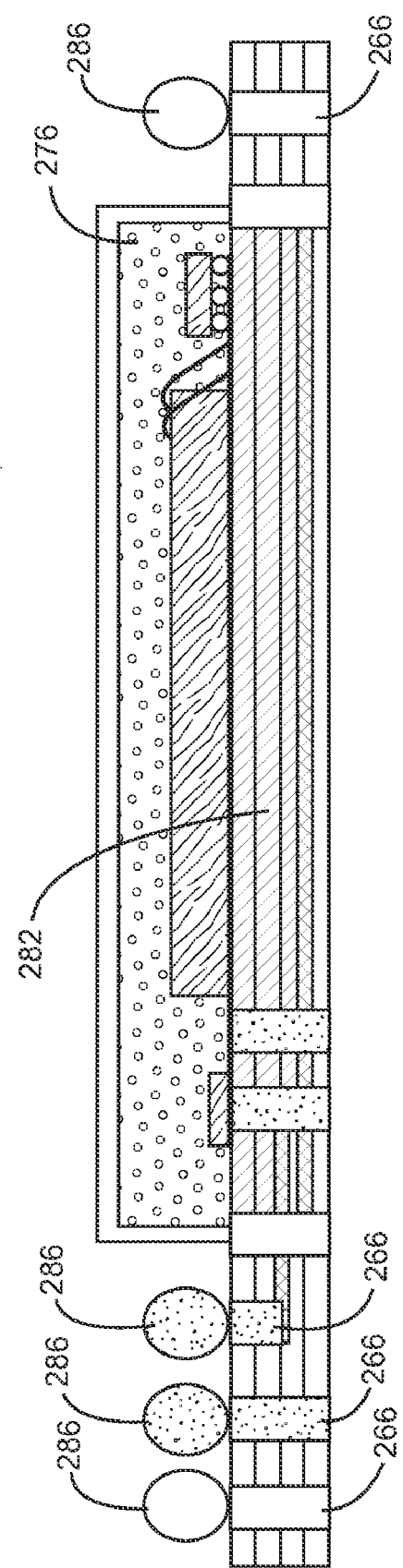
Figure 12:
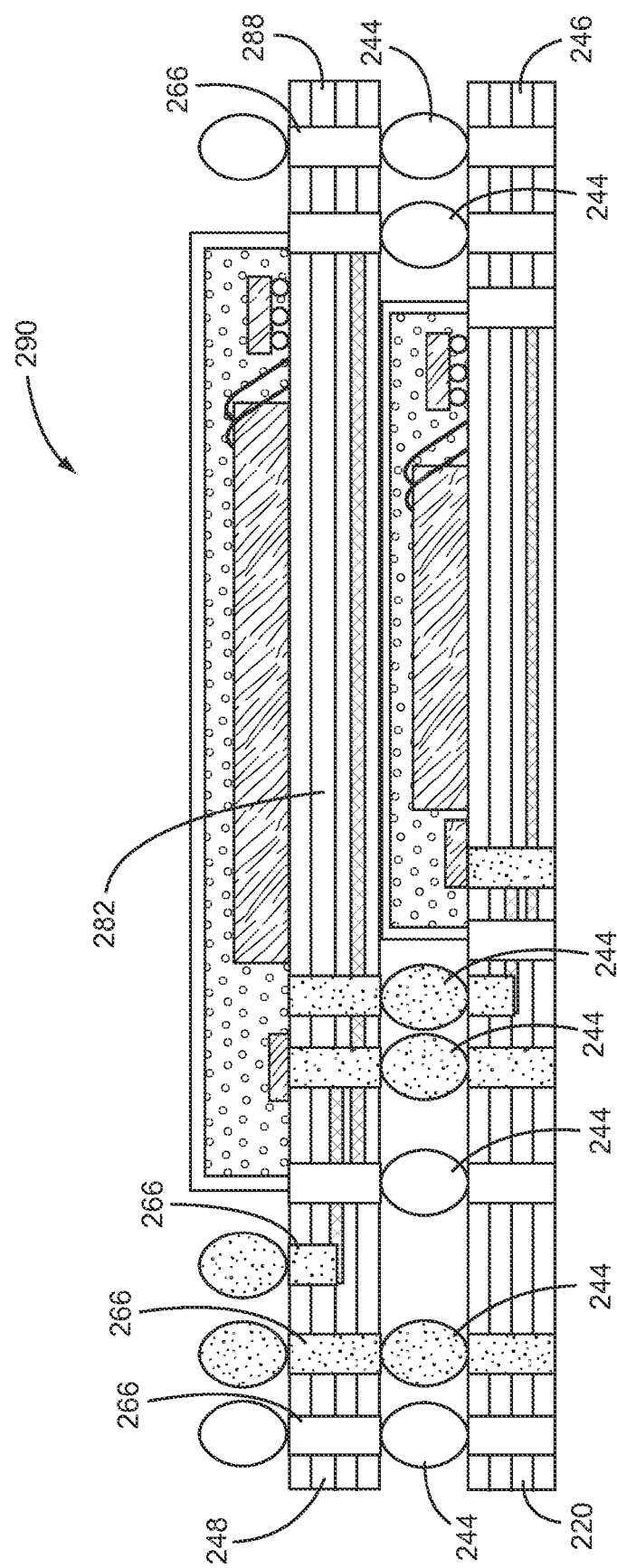
FIG. 12 illustrates the first embodiment of the electronic assembly having the middle level stacked over the lower level.

Next, an overmold 276 is disposed over the surface 256 to cover the electronic components 272 (FIG. 11E) and shaped into a desired form (FIG. 11F). A conductive material may then be coated or electroplated to form a conformal shield 280 over the overmold 276 (FIG. 11G). The conformal shield 280 may be coupled to the conductive vias 268 which in this embodiment are configured as a ring of conductive vias 268 in the substrate body 250. This ring of conductive vias 268 substantially surrounds a shielded volume 282 of the middle substrate 248. Thus, in this embodiment, a middle shield compartment 284 is formed from the conformal shield 280, the conductive vias 268, and the conductive layer 254. The middle shield compartment 284 substantially encapsulates the component area 274. Next, conductive elements 286 may then be coupled to conductive vias 266 to form a middle level 288 of the stacked configuration (FIG. 11H). In FIG. 12, middle substrate 248 is placed over the lower substrate 220 and the conductive elements 244 are attached to the conductive vias 266. The stacked configuration 290 is illustrated having two levels 246, 288.

Figure 13A:
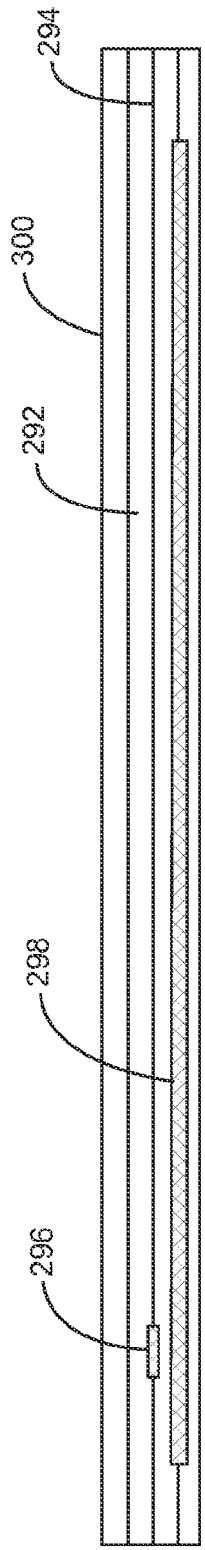
FIGS. 13A-13G illustrates steps for creating a top level of the first embodiment of the electronic assembly.
Figure 13B:
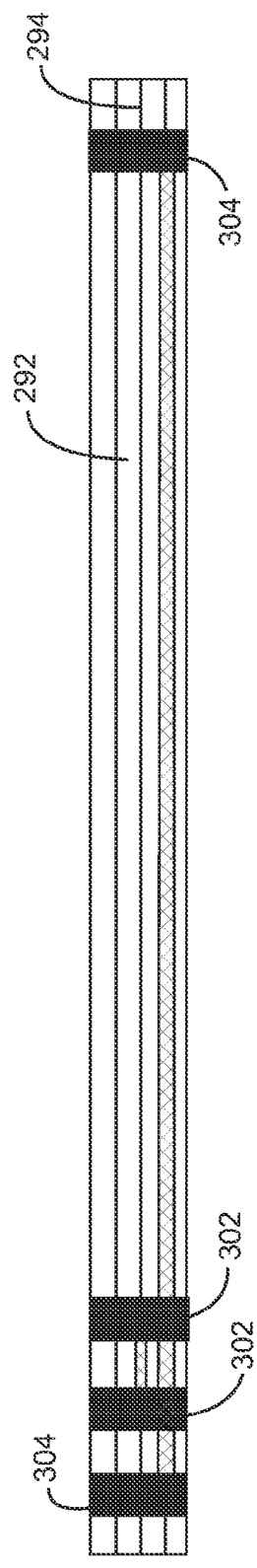
Figure 13C:
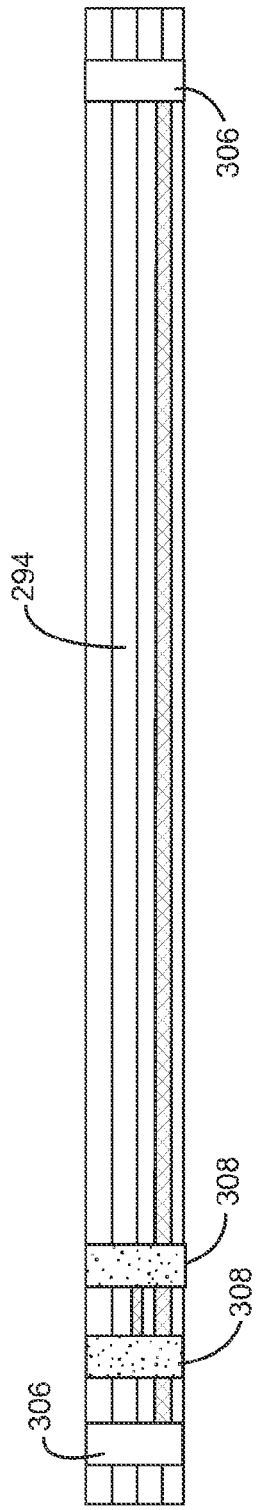
Figure 13D:
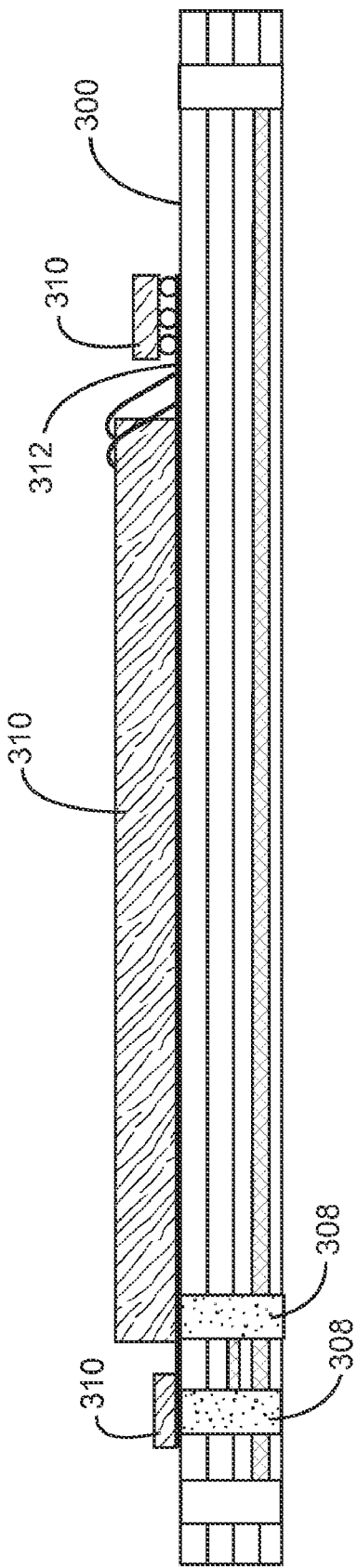
Figure 13E:
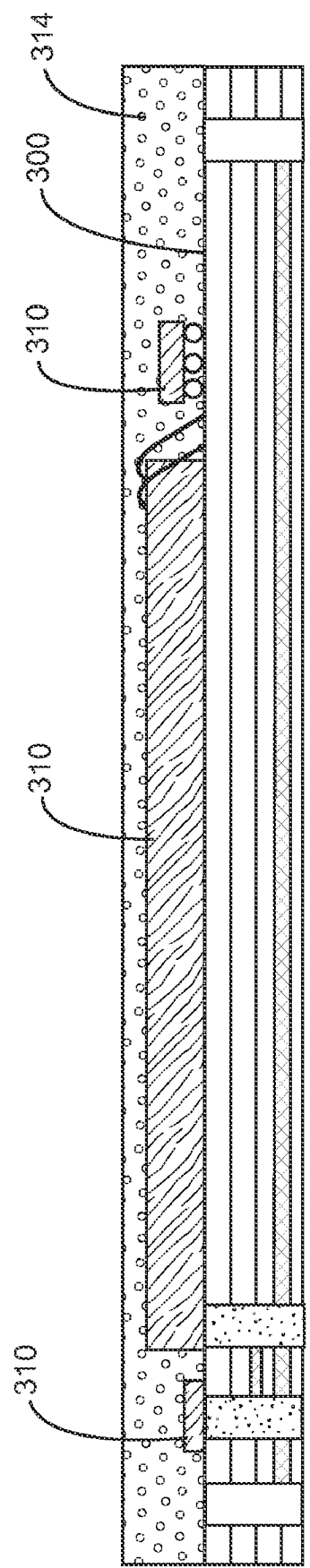

FIGS. 13A-13H illustrates steps for creating a top level of the stacked configuration 290. A top substrate 292 is provided having a substrate body 294 that includes conductive layers 296, 298 (FIG. 13A). The conductive layers 296, 298 may be substantially parallel with a surface 300 of the top substrate 292. Next, apertures 302, 304 are drilled or etched into the substrate body 294 of the top substrate 292 (FIG. 13B) and isolation devices (not shown) may be disposed within the apertures 302. Also, apertures 302, 304 may be configured as rings, as described above, parts of rings, and/or rows in the substrate body 294. Next, conductive vias 306, 308 are formed within the apertures 302, 304 (FIG. 13C). The conductive vias 306, 308 may be also be configured as rings as described above, parts of rings, and/or rows within the substrate body 294. Electronic components 310 may be provided on a component area 312 on the surface 300 and one or more of these electronic components 310 may be coupled to conductive vias 308 (FIG. 13D).

Figure 13F:
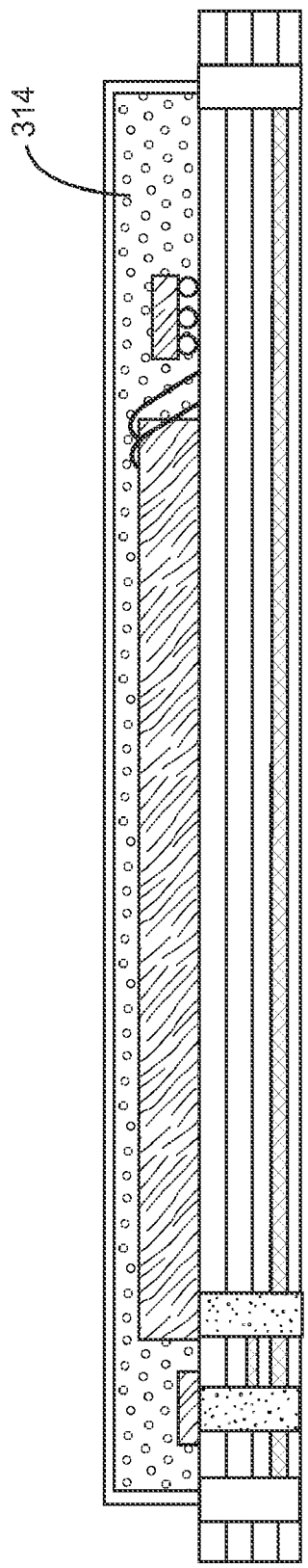
Figure 13G:
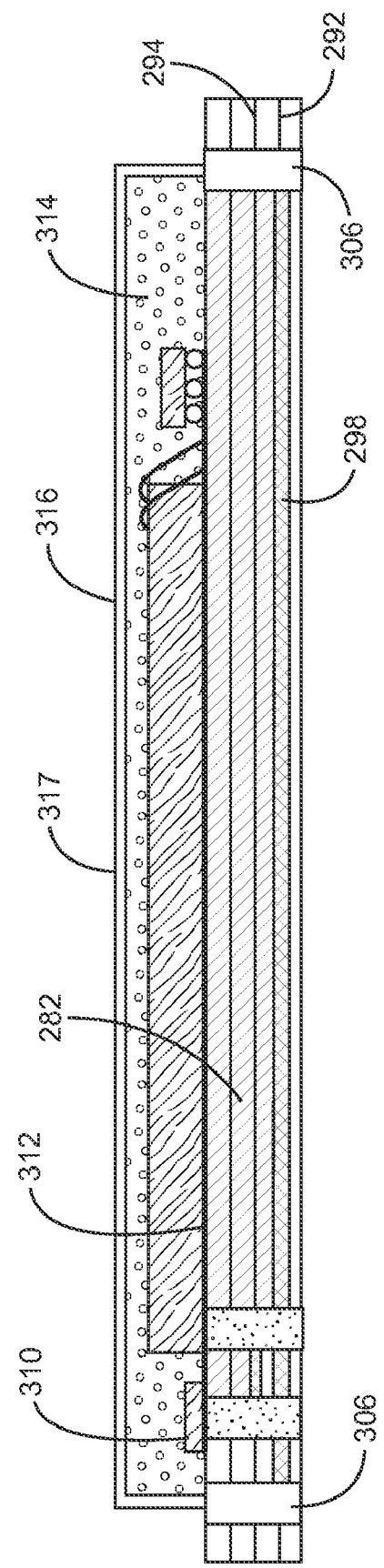

Next, an overmold 314 is disposed over the surface 300 to cover the electronic components 310 (FIG. 13E) and then shaped into a desired form (FIG. 13F). A conformal shield 316 may then be formed over the overmold 314 (FIG. 13G) by coating or through electroplating. The conformal shield 316 may be coupled to the conductive vias 306. In this embodiment, the conductive vias 306 are configured as a ring of conductive vias 306 within the substrate body 294 that substantially surround a shielded volume 282 of the top substrate 292. Thus, in this embodiment, a top shield compartment 317 is formed from the conformal shield 316, the conductive vias 306 and the conductive layer 298 to substantially encapsulate the component area 312 and form the top level 318 of the stacked configuration 290.

Figure 14:
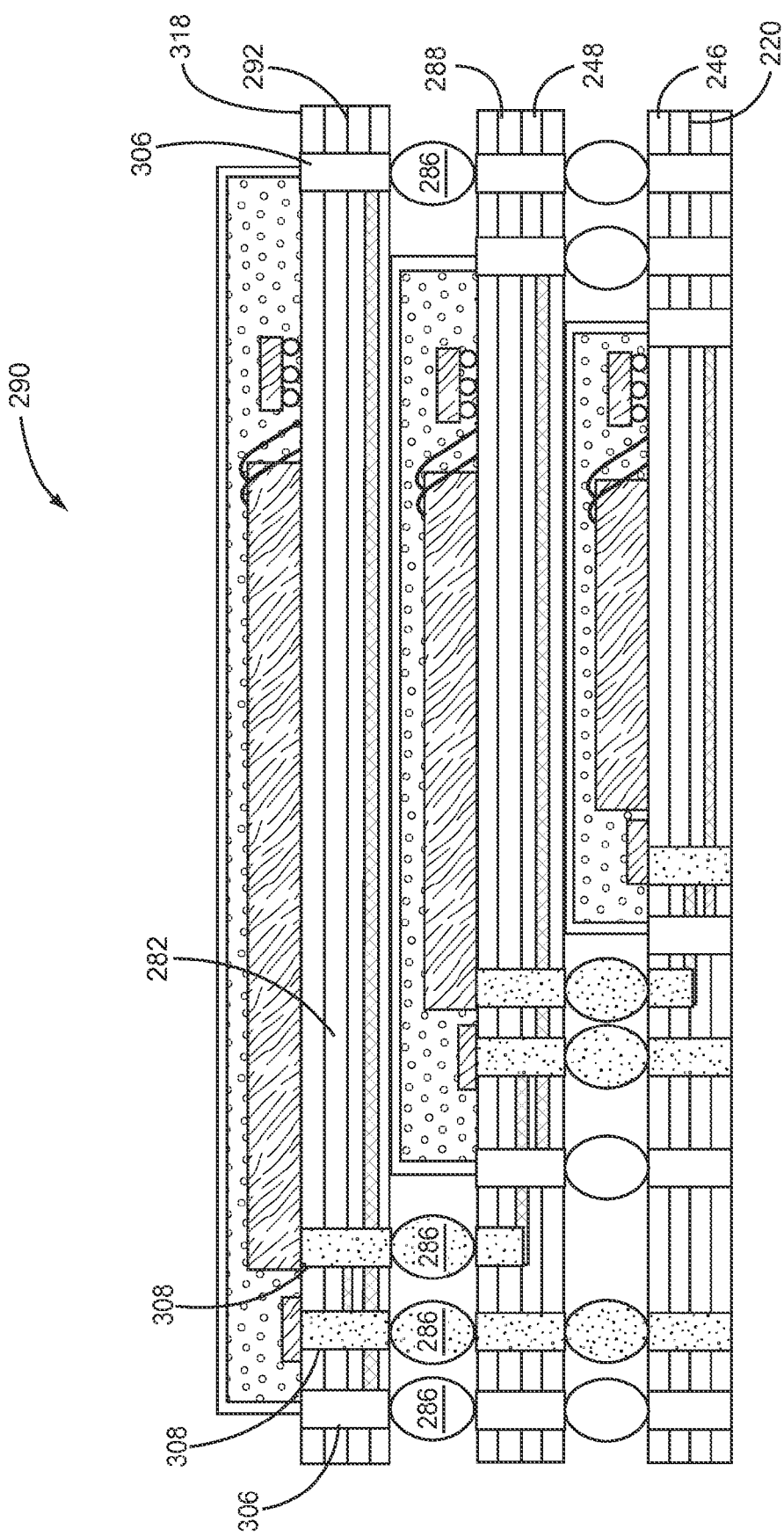
FIG. 14 is a cross section view of the first embodiment of the electronic assembly having the top level stacked over the middle and lower levels.
Figure 15:
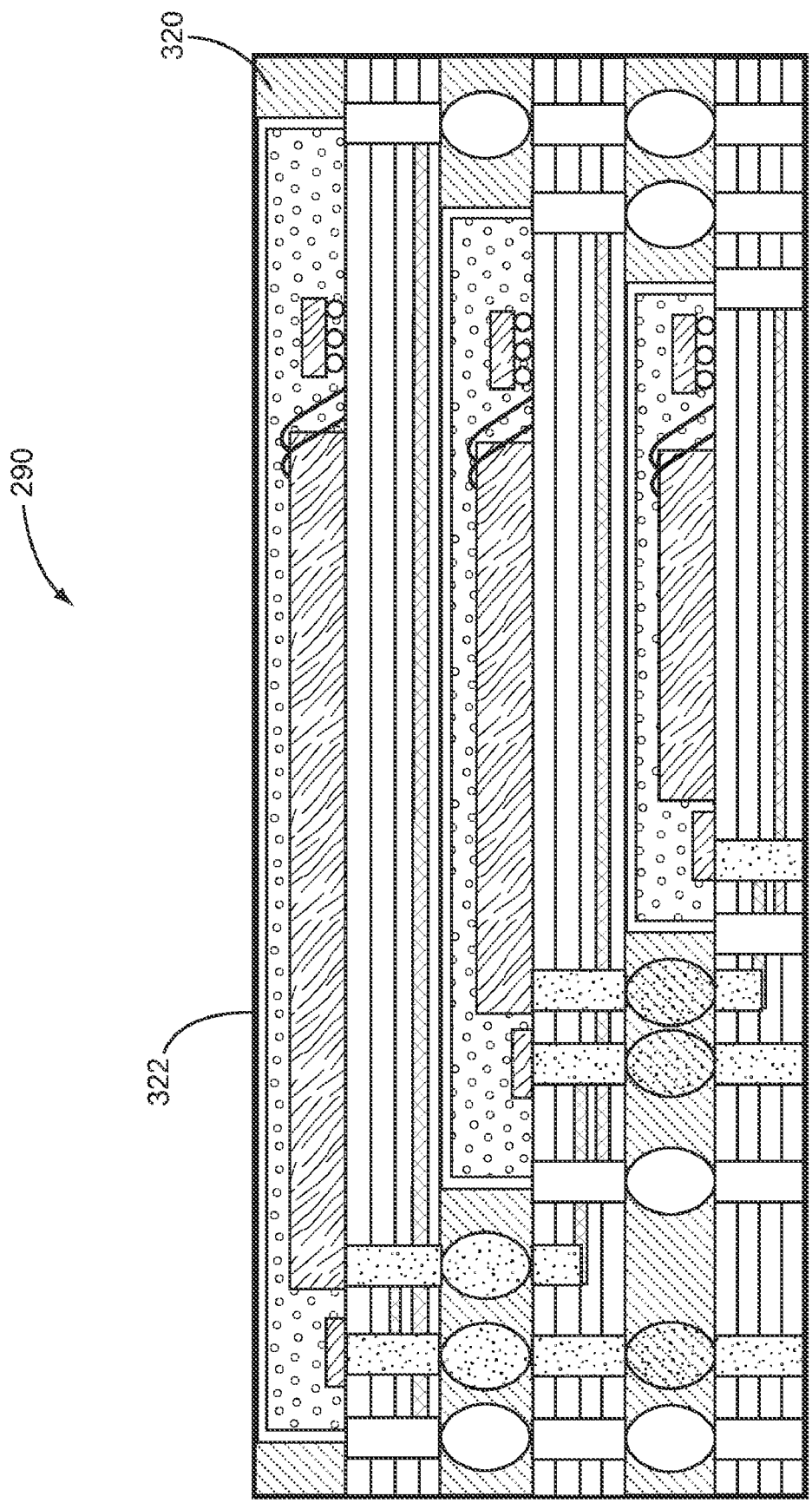
FIG. 15 is a cross sectional view of the first embodiment of the electronic assembly covered by a conformal shield.

Referring now to FIG. 14, the top substrate 292 is placed over the middle and lower substrate 248, 220 and the conductive elements 286 are attached to the conductive vias 306, 308. In this manner, the stacked configuration 290 is formed to have three levels 246, 288, 318. In FIG. 15, an overmold 320 is injected throughout the entire stacked configuration 290 and a conformal shield 322 is provided over the overmold 320 to provide additional shielding.

Figure 16:
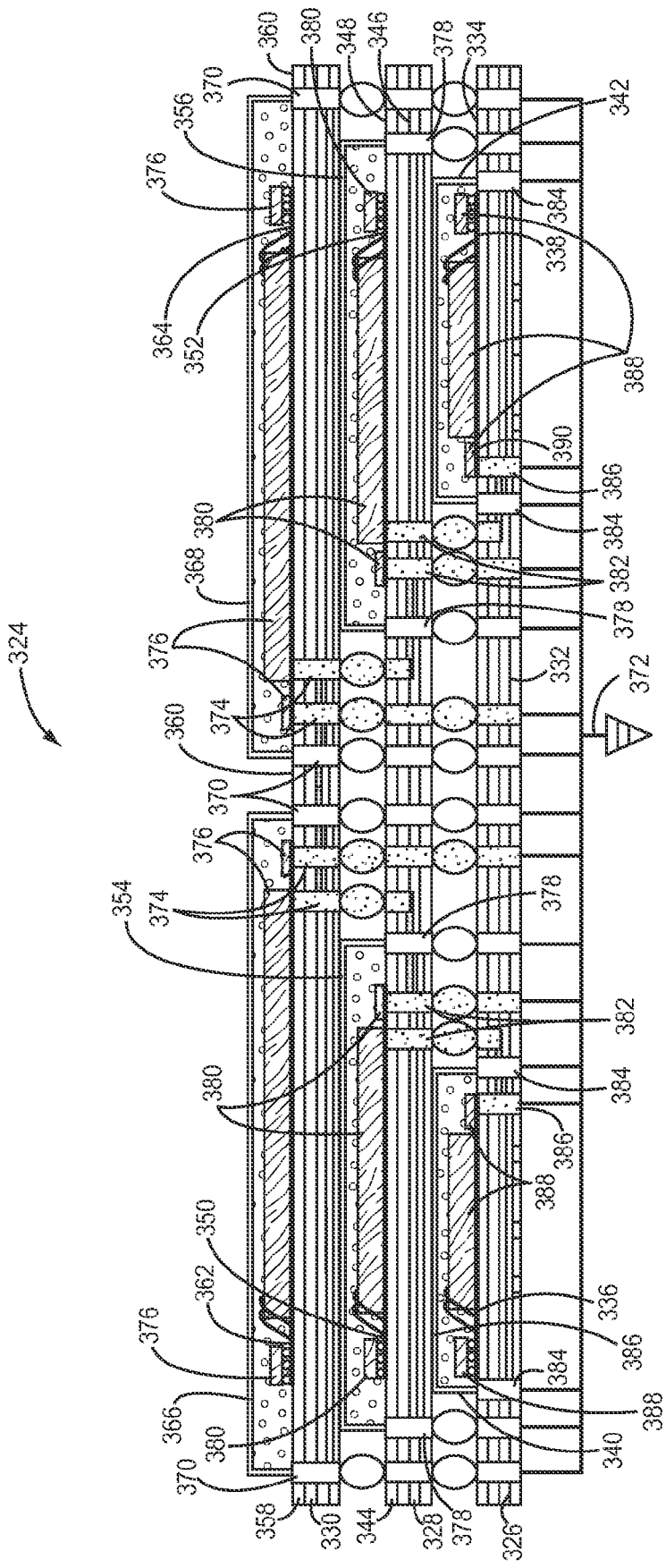
FIG. 16 is a cross sectional view of a second embodiment of the electronic assembly in a stacked configuration.

Next, FIG. 16 illustrates another embodiment of a stacked configuration 324 having three levels 326, 328, 330. In this embodiment, the lower level 326 has a substrate 332 that defines a surface 334 having two component areas 336, 338. These component areas 336, 338 are substantially encapsulated by lower electromagnetic shield compartments 340, 342. Similarly, the middle level 344 has a substrate 346 that defines a surface 348 having two component areas 350, 352. These component areas 350, 352 are substantially encapsulated by middle electromagnetic shield compartments 354, 356. Furthermore, the top level 330 has a substrate 358 that defines a surface 360 having two component areas 362, 364.

These component areas 362, 364 are substantially encapsulated by top electromagnetic shield compartments 366, 368.

Conductive paths 370 are coupled to the top electromagnetic shield compartments 366, 368 and formed down through all three levels 326, 328, 330 to couple each of the top electromagnetic shield compartments 366, 368 to a common node 372. Conductive paths 374 are also provided and formed down through all three levels to couple the electronic components 376 to a common node 372. Similarly, conductive paths 378 are coupled to the middle electromagnetic shield compartments 354, 356 and formed down through the bottom two levels 326, 328 to couple each of the middle electromagnetic shield compartments 354, 356 to the common node 372.

Additionally, conductive paths 382 are provided and formed down through the bottom two levels 326, 328 to couple the electronic components 380 to the common node 372. In the illustrated embodiment, the conductive paths 382 are part of the conductive paths 374 coupling the electronic components 376 from the top level 330. Finally, conductive paths 384 are provided to couple each of the lower electromagnetic shield compartments 340, 342 on the lower level 326 to the common node 372. Conductive paths 386 couple the electronic components 388 to the common node 372. These conductive paths 386 may be part of the conductive paths 374, 382 coupling the electronic components 376, 380 on the top two levels 328, 330 to the common node 372.

Those skilled in the art will recognize improvements and modifications to the present disclosure. All such improvements and modifications are considered within the scope of the concepts disclosed herein and the claims that follow.

What is claimed is:

1. An electronic assembly in a stacked configuration, comprising:
   a first substrate having a first body that defines a first surface, the first body having a first conductive layer substantially parallel to the first surface, a first conductive via coupled to the first conductive layer, and a second conductive via;
   a first electronic component formed on the first surface;
   a first overmold covering the first electronic component;
   a first conformal shield formed over the first overmold and coupled to the first conductive via;
   a second substrate provided over the first substrate, the second substrate having a second body that defines a second surface, the second body having a second conductive layer substantially parallel to the second surface, a third conductive via coupled to the second conductive layer, wherein the third conductive via is coupled to the second conductive via;
   a second electronic component formed on the second surface;
   a second overmold covering the second electronic component; and
   a second conformal shield formed over the second overmold and coupled to the third conductive via.

2. The electronic assembly of claim 1, further comprising a first conductive element connected to the second and third conductive via and positioned between the first and second substrate.

3. The electronic assembly of claim 1, wherein at least one of the first and second bodies are formed from a material selected from a group consisting of a polyamide, ceramic, and an alumina.

4. The electronic assembly of claim 1, wherein each of the first and second overmolds are formed from a dielectric material.

5. The electronic assembly of claim 1, further comprising a common node wherein the first and second conductive vias are coupled to the common node.

6. The electronic assembly of claim 5, wherein the common node is underneath the first substrate.

7. The electronic assembly of claim 1, further comprising a ground plate wherein the first and second conductive vias are coupled to the ground plate.

8. The electronic assembly of claim 1, wherein the first electronic component is formed directly over the first conductive layer.

9. The electronic assembly of claim 1, wherein the second electronic component is formed directly over the second conductive layer.

10. The electronic assembly of claim 1, further comprising:
the second body of the second substrate having a fourth conductive via coupled to the second electronic component and extending through the second conductive layer; and
the first body of the first substrate having a fifth conductive via coupled to the fourth conductive via of the second substrate.

11. The electronic assembly of claim 10, further comprising a common node wherein the fifth conductive via is coupled to the common node.

12. The electronic assembly of claim 10, further comprising the first body of the first substrate having a sixth conductive via wherein the sixth conductive is coupled to the first electronic component and the fifth conductive via.

13. The electronic assembly of claim 12, wherein the fourth conductive via is coupled to an input/output terminal of the second electronic component and the sixth conductive via is coupled to an input/output terminal of the first electronic component.

14. The electronic assembly of claim 12, further comprising a common node wherein the sixth conductive via is coupled to the common node.

15. The electronic assembly of claim 12 wherein the first body of the first substrate comprises a third conductive layer substantially parallel to the first surface and coupled between the fifth and sixth conductive vias.

16. The electronic assembly of claim 1, further comprising:
a third substrate provided over the second substrate, the third substrate having a third body that defines a third surface, the third body having a third conductive layer substantially parallel to the third surface, a fourth conductive via coupled to the third conductive layer;
a third electronic component formed on the third surface over the third conductive layer;
a third overmold covering the third electronic component;
a third conformal shield formed over the third conformal shield and coupled to the fourth conductive via;
the second body of the second substrate having a fifth conductive via coupled to the fourth conductive via of the third substrate; and
the first body of the first substrate having a sixth conductive via coupled to the fifth conductive via of the second substrate.

17. The electronic assembly of claim 16, further comprising:
a first conductive element coupled to the second and third conductive via and being positioned between the first and second substrate;
a second conductive element coupled to the fifth conductive via and the sixth conductive via and being positioned between the first and second substrate; and a third conductive element coupled to the fourth and fifth conductive via and being positioned between the second and third substrate.

18. The electronic assembly of claim 17, further comprising a common node wherein the first, second, and sixth conductive vias are coupled to the common node.

19. The electronic assembly of claim 1, wherein at least one of the electronic components comprises an electronic circuit having a flip chip die that attaches the electronic circuit to the respective substrate.

20. The electronic assembly of claim 1, wherein at least one of the electronic components comprises an electronic circuit having a wire bond that attaches the electronic circuit to the respective substrate.

21. The electronic assembly of claim 1, wherein at least one of the electronic components is soldered to the respective substrate.

22. The electronic assembly of claim 1, wherein at least one of the electronic components further comprises a semiconductor substrate and an electronic circuit formed on the semiconductor substrate.

23. The electronic assembly of claim 1, further comprising at least one electromagnetic shield compartment that substantially encapsulates one of the electronic components wherein the electromagnetic shield compartment comprises one of the conformal shields and the one of the conductive layers.

24. The electronic assembly of claim 1, further comprising:
a first electromagnetic shield compartment comprising the first conformal shield and the first conductive layer, wherein the first electromagnetic shield compartment substantially encapsulates the first overmold and a first substrate volume of the first substrate above the first conductive layer within the first substrate; and
a second electromagnetic shield compartment comprising the second conformal shield and the second conductive layer, wherein the second electromagnetic shield compartment substantially encapsulates the second overmold and a second substrate volume of the second substrate above the second conductive layer.

25. The electronic assembly of claim 24 wherein the second electromagnetic shield compartment is positioned at least partially directly over the first electromagnetic shield compartment.

26. The electronic assembly of claim 25, further comprising the second electromagnetic shield compartment further comprising a first plurality of conductive vias formed in the second body of the second substrate and are coupled to the second conformal shield wherein the first plurality of conductive vias includes the third conductive via and the first plurality of conductive vias substantially surrounds the second substrate volume within the second body of the second substrate.

27. The electronic assembly of claim 26, wherein the first body of the first substrate has a second plurality of conductive vias which are coupled to the first plurality of conductive vias, the second plurality of conductive vias including the second conductive via and the second plurality of conductive vias substantially surround the first plurality of conductive vias.

28. The electronic assembly of claim 27, further comprising a first plurality of conductive elements, the first plurality of conductive elements being coupled to the first plurality of conductive vias and the second plurality of conductive vias wherein the first plurality of conductive elements are positioned between the first and second substrate.

29. The electronic assembly of claim 27, further comprising:
the first electromagnetic shield compartment further comprising a third plurality of conductive vias formed in the first body of the first substrate which are each connected to the first conformal shield wherein the third plurality of conductive vias substantially surrounds the first shielded volume; and wherein the third plurality of conductive vias are substantially surrounded by the second plurality of conductive vias.

30. An electronic assembly in a stacked configuration, comprising:

a first substrate defining a first surface having a first component area;

a first electronic component formed on the first component area of the first surface;

a first electromagnetic shield compartment that substantially encapsulates the first component area, the first electromagnetic shield compartment having a first shield layer within the first substrate and a first plurality of conductive vias formed within the first substrate wherein the first plurality of conductive vias substantially surround a volume in the first substrate between the first component area and the first shield layer;

a second substrate positioned under the first substrate, the second substrate having a second component area;

a second electronic component formed on the second component area of the second surface; and a second plurality of conductive vias formed within the second substrate, the second plurality of conductive vias being coupled to the first plurality of conductive vias.

31. The electronic assembly of claim 30, further comprising:

a second electromagnetic shield compartment that substantially encapsulates the second component area, the second electromagnetic shield having a second shield layer within the second substrate and a third plurality of conductive vias that substantially surround a volume of the second substrate between the second component area and the second shield layer; and wherein the second plurality of conductive vias substantially surround the third plurality of conductive vias within the second substrate.

32. The electronic assembly of claim 31, further comprising:

a third substrate positioned between the first and second substrates, the third substrate having a third component area;

a third electronic component formed on the third component area; and a third electromagnetic shield compartment that substantially encapsulates the third component area, the third electromagnetic shield compartment having a third shield layer within the third substrate and a fourth plurality of conductive vias that substantially surround a volume of the third substrate between the third component area and the third shield layer; and a fifth plurality of conductive vias formed within the third substrate which are coupled to the first and second plurality of vias, wherein the fifth plurality of conductive vias substantially surround the fourth plurality of conductive vias within the third substrate.

33. The electronic assembly of claim 32, further comprising a sixth plurality of conductive vias formed within the second substrate and being coupled to the fourth plurality of conductive vias wherein the sixth plurality of conductive vias substantially surround the third plurality of conductive vias and the second plurality of conductive vias substantially surrounds the sixth plurality of conductive vias.

34. An electronic assembly in a stacked configuration comprising:

a first substrate having a first component area;

a first electronic component formed on the first component area;

a first electromagnetic shield compartment that substantially encapsulates the first component area;

a second substrate positioned under the first substrate and having a second component area;

a second electronic component formed on the second component area;

a first plurality of conductive vias formed within the second substrate; and a first plurality of conductive elements coupled to the first electromagnetic shield compartment and the first plurality of conductive vias, wherein the first plurality of conductive elements are positioned between the first and second substrate and substantially surround the second component area.

35. The electronic assembly of claim 34, further comprising:

a third substrate positioned under the second substrate and having a third component area;

a third electronic component formed on the third component area;

a second plurality of conductive vias formed within the third substrate;

a second electromagnetic shield compartment that substantially encapsulates the second component area;

a second plurality of conductive vias formed within the third substrate; and a second plurality of conductive elements coupled to the second electromagnetic shield compartment and the second plurality of conductive vias, wherein the second plurality of conductive elements are positioned between the second and third substrate and substantially surround the third component area.

36. The electronic assembly of claim 35, further comprising:

a third plurality of conductive vias formed within the third substrate; and a third plurality of conductive elements coupled to the first and third plurality of conductive vias and being positioned between the second and third substrates wherein the third plurality of conductive elements substantially surround the second plurality of conductive elements.

37. The electronic assembly of claim 36, further comprising a third electromagnetic shield compartment substantially encapsulating the third component area.

* * * * *